United States Patent [19]
Arimoto et al.

[11] Patent Number: 5,406,094
[45] Date of Patent: Apr. 11, 1995

[54] QUANTUM INTERFERENCE EFFECT SEMICONDUCTOR DEVICE AND METHOD OF PRODUCING THE SAME

[75] Inventors: Hiroshi Arimoto; Shigehiko Sasa; Akira Endoh, all of Kawasaki, Japan

[73] Assignee: Fujitsu Limited, Kawasaki, Japan

[21] Appl. No.: 931,479

[22] Filed: Aug. 19, 1992

[30] Foreign Application Priority Data

Oct. 14, 1991 [JP] Japan .................... 3-264503
May 27, 1992 [JP] Japan .................... 4-134822

[51] Int. Cl.⁶ ............................................. H01L 29/80
[52] U.S. Cl. ........................................ 257/24; 257/12; 257/14; 257/27; 257/194
[58] Field of Search ............... 257/194, 12, 14, 20, 257/23, 24, 27, 29, 183, 192, 472

[56] References Cited

U.S. PATENT DOCUMENTS

| | | | |
|---|---|---|---|
| 4,550,330 | 10/1985 | Fowler | 357/16 |
| 4,748,484 | 5/1988 | Takakuwa et al. | 257/194 |
| 4,908,325 | 3/1990 | Berenz | 257/194 |
| 4,977,435 | 12/1990 | Yoshimura et al. | 257/194 |
| 5,151,757 | 9/1992 | Enoki et al. | 257/194 |

FOREIGN PATENT DOCUMENTS

63-93161 4/1988 Japan .
1-189968 7/1989 Japan .

OTHER PUBLICATIONS

S. Datta, "Quantum Devices", *Superlattices and Microstructures*, vol. 6, No. 1, 1989, pp. 83–93.

*Primary Examiner*—Sara W. Crane
*Attorney, Agent, or Firm*—Staas & Halsey

[57] ABSTRACT

A quantum interference effect transistor comprising a semiconductor substrate, an n-type first semiconductor layer, a channel second semiconductor layer, an n-type third semiconductor layer, a gate electrode, a source electrode, a drain electrode, a source region and a drain region, said second semiconductor layer having an electron affinity larger than that of the first and third layers to generate a two dimensional electron gas channel, characterized in that the channel second layer between the source and drain regions consists of lead portions and a middle portion sandwiched with them, and in the middle portion the channel is divided into two channel passages without forming a separation layer in the second layer. The first, second and third layers form a quantum well structure. The middle portion of the second layer is thicker than the lead portions, so that a quantum well width at the middle portion is wider and has a larger amount of bending of a conduction band bottom Ec to divide an electron probability distribution into two parts with peaks.

27 Claims, 19 Drawing Sheets

QUANTUM INTERFERENCE EFFECT SEMICONDUCTOR DEVICE AND METHOD OF PRODUCING THE SAME

BACKGROUND OF THE INVENTION

1. Field of the Invention

The present invention relates to a semiconductor device, and more particularly, to a quantum interference effect semiconductor device utilizing the Aharonov-Bohm (A-B) effect and a method of producing the same.

The function of electronic apparatuses, such as computers has become increasingly complex, resulting in a demand for high speed semiconductor devices. There are proposed devices for answering the demand. One of the proposals is the quantum interference effect semiconductor device which can operate at an extremely high speed by using a quantum interference effect based on a wave property of electron in quantum electronics (quantum mechanics).

2. Description of the Related Art

Due to the wave property of electrons (electron wave), when electrons flow through two paths (channels) between two leads and an electric field is applied to one of the paths (or a magnetic field is applied to an area which is enclosed with the two paths) to influence the electron wave, a phase difference between the electron waves of electrons flowing the two paths is generated, causing the two electron waves to interfere with each other. As a result, the A-B effect appears as an interference effect in quantum mechanics (e.g., cf. S. Datta, "Quantum Devices", Superlattices and Microstructures, Vol. 6, No. 1, 1989, pp. 83–93).

There is a proposed quantum interference effect transistor (semiconductor device) using the A-B effect, as shown in FIG. 1, which uses a two dimensional electron gas in a GaAs/AlGaAs hetero-structure (see, e.g., U.S. Pat. No. 4,550,330 and Japanese Patent Application No. 3-26426). In this quantum interference transistor, a buffer GaAs layer 82, an undoped GaAs channel layer 84 and an n-type AlGaAs electron-supply layer 86 are epitaxially formed on a semi-insulating substrate (not shown) and are patterned to form a predetermined shape consisting of two lead portions and a ring-portion therebetween, as shown in FIG. 1. A source electrode 92 and a drain electrode 94 are formed on the AlGaAs layer 86 at the two lead portions, and a source region 93 and a drain region 95 are formed in the lead portions of the layers 86, 84 and 82 under the electrodes 92 and 94, respectively. A gate electrode 90 is formed on the AlGaAs 86 at a portion of the half-ring.

When the quantum interference transistor operates, a two-dimensional electron gas 88 is generated in the channel GaAs layer 84 in the proximity of the interface between the layers 84 and 86, and flows from the source region 93 to the drain region 95 through two paths of the ring portion. When a voltage is applied to the gate electrode 90, the electron wave of the electron gas 88 flowing through the path under the electric field of the gate electrode 90 is varied with the result that a phase difference between the electron waves flowing through the two paths occurs. Thus, the interference between the electron waves is dependent on the phase difference and varies the drain current. Therefore, since the phase difference between the electron waves is dependent on the voltage applied to the gate electrode 90, a modulation of the gate voltage realizes a modulation of the drain current.

In order to cause a sufficiently interference effect, it is necessary to prevent the electrons from being subjected to not only an inelastic scattering but also an elastic scattering. However, in the above-mentioned quantum interference transistor, it is very difficult to form the ring with a high degree of accuracy and shorten a distance between the source and drain regions. Furthermore, the curve paths for guiding the electron waves in the ring portion easily cause the elastic scattering therein, which weakens the interference effect. Accordingly, the modulation of the drain current of the quantum interference effect transistor due to the interference effect is very small.

There is another proposed quantum interference effect transistor (semiconductor device), as shown in FIG. 2, which has two straight paths (layers) for passing electron waves so as to prevent the elastic scattering (see, e.g., Japanese Unexamined Patent Publication (Kokai) No. 63, 93161, published on Jul. 31, 1989). In this case, on a semi-insulating GaAs substrate 96, a GaAs buffer layer 98, a lower AlGaAs layer 102, a first channel GaAs layer 106, a separation AlGaAs layer 108, a second channel GaAs layer 104 and an upper AlGaAs layer 100 are continuously and epitaxially formed, in which the first channel GaAs layer 106 is a quantum well formed by sandwiching it between the lower AlGaAs layer 102 and the separation AlGaAs layer 108, and the second channel GaAs layer 104 is also another quantum well formed by sandwiching it between the separation AlGaAs layer 108 and the upper AlGaAs layer 100. A source electrode 114 and a drain electrode 116 are formed on the upper AlGaAs layer 100 and then are heat-treated to form an n+-type alloy-contact (source) region 110 and an n+-type alloy-contact (drain) region 112 extending into the lower AlGaAs layer 102. A gate electrode 118 is formed on the upper AlGaAs layer 100 at a center between the electrodes 114 and 116.

In the quantum interference effect transistor having two double-hetero-junction structures for the two channels, an electron wave from the alloy-contact (source) region 110 is separated into two electron waves which flow through the first and second channel GaAs layers 106 and 104 and reach the alloy-contact (drain) region 112. When a voltage is applied to the gate electrode 118 to influence the electron waves, a phase difference between the electron waves flowing through the two channels occurs. Thus, the two electron waves having the phase difference therebetween interfere with each other at the alloy-contact (drain) region 112, to vary the drain current, depending on the phase difference. Since the GaAs channel layers 104 and 106 are straight, the elastic scattering is small. Nevertheless, the electron wave is subjected to the inelastic scattering in the alloy-contact regions (i.e., lead channel portions) 110 and 112, so that the two electron waves flowing through the two channel GaAs layers have a phase difference at a random value. Accordingly, although the control of the phase difference by a gate voltage of the gate electrode 118 is attempted, it is difficult to obtain meaningful interference information. Taking the above-mentioned facts into consideration, the electron wave which can vary the drain current by the interference effect is specified to be an electron wave which is not subjected to the inelastic scattering in the regions (lead channel portions) 110 and 112 with the result that the efficiency of the modulation of the drain current is greatly lowered.

Furthermore, another type of quantum interference effect transistor shown in FIG. 3 has been proposed. On a semiconductor substrate 120, a buffer semiconductor layer 122, a lower n-type AlGaAs layer 124, a channel GaAs layer 128 and an upper n-type AlGaAs layer 126 are formed to interpose the channel GaAs layer 128 between the AlGaAs layers 124 and 126. A GaAsAlGaAs hetero-junction structure induces two-dimensional electron gas as a carrier, in the channel GaAs layer 128. In the quantum transistor, an island-shaped AlGaAs separation layer 130 is provided within the channel GaAs layer 128 to separate a middle portion of the channel layer 128 into two parts, as shown in FIG. 3. A source electrode 134 and a drain electrode 136 are formed on the upper AlGaAs layer 126 above the ends of the channel layer 128. An n+-type alloy-contact (source) region 135 and an n+-type alloy-contact (drain) region 137 are formed by annealing method to extend into the buffer layer 122 under the electrodes 134 and 136, respectively. A gate electrode 132 is then formed on the upper AlGaAs layer 126 above the middle portion (i.e., the island-shape separation layer 130).

An electron wave flowing from the source region 135 is separated into two electron waves which flow through an upper part and a lower part of the middle portion of the channel GaAs layer 128 and combine into an electron wave flowing into the drain region 137. When a voltage is applied to the gate electrode 132 to influence the electron waves, a phase difference between the electron waves flowing through the upper part and the lower part appears.

In order to form the island-shape separation AlGaAs layer 130 and the channel GaAs layer 128 surrounding the layer 130, an AlGaAs layer for the separation layer 130 is grown (formed) on a half of the GaAs layer 128 and is selectively etched to grow (form) the island-shape separation AlGaAs layer 130, and then the remaining half of the GaAs layer 128 is formed over the former GaAs layer 128 and the AlGaAs layer 130. Where an etching step is interposed between the growing steps of AlGaAs and GaAs, the AlGaAs layer is exposed to the atmosphere, so that the surface of the AlGaAs layer is very easily oxidized and both of the AlGaAs layer and the GaAs layer are easily contaminated by absorption of carbon atoms. As a result, a large number of interface states caused by impurities are generated between the AlGaAs layer 130 and the GaAs layer 128 to trap and/or scatter electrons flowing through the channel GaAs layer 128, which prevents effective interference from occurring.

As mentioned above, in conventional quantum interference effect transistors it is difficult to generate a sufficient electron wave interference. Furthermore, although the interference of the electron wave occurs, such an interference effect is not effective to control the drain current.

SUMMARY OF THE INVENTION

An object of the present invention is to provide an improved quantum interference effect transistor (semiconductor device) that has an effective interference effect, operates at a super-high speed and at a very low power consumption and increases a degree of integration.

Another object of the present invention is to provide an improved method of producing the quantum interference effect transistor.

The above-mentioned objects and other objects of the present invention are attained by providing a quantum interference effect semiconductor device (transistor) comprising:

an n-type first semiconductor layer formed on a semiconductor substrate;

a channel second semiconductor layer which is formed on the first semiconductor layer and has an electron affinity larger than that of the first semiconductor layer, and in which a two dimensional electron gas channel is generated;

an n-type third semiconductor layer which is formed on the second semiconductor layer and has an electron affinity smaller than that of the second semiconductor layer;

a gate electrode formed on the third semiconductor layer;

a source electrode and a drain electrode formed on the third semiconductor layer and located apart from the gate electrode on each sided of the gate electrode;

a source region formed under the source electrode and extending into the first semiconductor layer; and a drain region formed under the drain electrode and extending into the first semiconductor layer; characterized in that the two dimensional electron gas channel generated in the second channel layer between the source region and the drain region consists of lead channel portions near the source region and the drain region, each of which channel portions forms one channel passage, and a middle channel portion which is located below the gate electrode and is divided into a first channel passage in proximity to a first interface between the first and second semiconductor layers and a second channel passage in proximity to a second interface between the second and third semiconductor layers.

According to the present invention, a method of producing a quantum interference effect semiconductor device comprises the steps of:

forming an n-type first semiconductor layer on a semiconductor substrate;

forming a channel second semiconductor layer having an electron affinity larger than that of the first semiconductor layer and including a middle portion in which a channel is divided into a first lower channel passage and a second upper channel passage, on the first semiconductor layer;

forming an n-type third semiconductor layer on the channel layer;

forming a source electrode and a drain electrode on the third semiconductor layer;

forming a source region and a drain region extending into the first semiconductor layer by an annealing method; and forming a gate electrode on the third semiconductor layer between the source and drain electrodes and above the middle portion of the channel second semiconductor layer.

According to the present invention, the two dimensional electron gas channel generated in the channel semiconductor layer is divided into two (first and second) channel passages in the middle portion of the channel semiconductor layer by making two peaks in an electron probability density distribution near the interfaces between the lower surface of the channel layer and the upper surface of the first semiconductor layer and between the upper surface of the channel layer and the lower surface of the third semiconductor layer without forming a ring shape of a channel layer or providing a separation layer (and an island-shape separation) within a channel layer. It is possible to make the two peaks by (1) making the middle portion of the channel layer thicker than the rest (lead) portions, (2) forming an n-type impurity high concentration region in a middle portion of the first semiconductor layer near the interface between the first and second (channel) layers and below the gate electrode and/or another n-type impurity high concentration region in a middle portion of the third semiconductor layer near the interface between the second (channel) and third layers and below the gate electrode, (3) forming an n-type impurity high concentration region in a middle portion of the first semiconductor layer near the interface between the first and second (channel) layers and below the gate electrode and forming two channel control electrodes on the third semiconductor layer at both sides of the gate electrode, and (4) making the channel layer thick to generate the two peaks therein and forming four conversion regions which provide sloping connection lines between the conduction band bottoms of the first and second layers and of the second and third layers and correspond to the lead portions of the channel layer.

To form the thicker middle portion of the channel second semiconductor layer, (A) the second semiconductor layer is grown on the flat semiconductor substrate, and is selectively etched to decrease a thickness of the rest portion except the middle portion, (B) the flat semiconductor substrate is selectively etched to form a groove of an inverted isosceles trapezoid at a position corresponding to the middle portion, and then the second semiconductor layer is grown on the substrate to form the thicker middle portion thereof on a bottom flat surface of the groove and the thinner lead portions thereof on slopes of the groove, or (c) the flat semiconductor substrate is selectively etched to form a projecting mesa portion of an isosceles trapezoid at a position corresponding to the middle portion, and then the second semiconductor layer is grown over the substrate to form the thicker middle portion thereof above a mesa top flat surface and the thinner lead portions thereof above slopes of the mesa portion. The thicker middle portion of the channel layer is suitable for a wide quantum well and the thinner lead portion (slope portion) is suitable for a narrow quantum well. It is preferable that the top flat surface being an original surface of the substrate and the bottom flat surface of the groove are (100) plane and the slope surfaces are (111)A plane. When each of the first, second and third semiconductor layers is epitaxially grown on the substrate with the groove (or the mesa portion), a thickness of the slope portions thereof on the slope surfaces is about 70% of that of the flat portions thereof on the bottom surface and the top surface.

It is possible to adopt the semiconductor substrate with the (or the mesa portion) groove in the above-mentioned case (2) using the n-type impurity high concentration region and in the above-mentioned case (3) using the channel control electrodes.

According to the present invention, since the thickness of the channel layer is thin enough to form a quantum well, the two divided channel passages are substantially straight, which reduce influences of the inelastic scattering and elastic scattering of the electrons. Thus, the electron wave interference of the ballistic electrons appears.

Preferably, a non-doped fourth semiconductor layer (spacer layer) having an electron affinity smaller than that of the second (channel) semiconductor layer is additionally formed between the first and second semiconductor layers to improve controllability of the two dimensional electron gas concentration and its mobility. Also, preferably, another non-doped fifth semiconductor layer (spacer layer) having an electron affinity smaller than that of the second (channel) semiconductor layer is additionally formed between the second and third semiconductor layers.

It is preferable that the quantum interference effect semiconductor device includes two barrier regions which are formed in the middle portion of the channel layer and are arranged in a direction at right angles to a channel direction to form a slit portion of the channel layer between the barrier regions, so that a kinetic energy of the two dimensional electron gas at right angles to the channel direction is quantized in a quantum well.

It is possible to form the n-type first and/or third semiconductor layer by growing an undoped semiconductor layer and doping it with impurities by an atomic-plane doping method.

BRIEF DESCRIPTION OF THE DRAWINGS

The present invention will be more apparent from the description of the preferred embodiments set forth below, with reference to the accompanying drawings, in which:

FIG. 5b is a conduction band bottom diagram taken along line A—A of FIG. 5a;

FIG. 6b is an energy band (conduction band bottom) diagram taken along line A—A of FIG. 6a;

FIG. 6c is an energy band (conductor band bottom) diagram taken along line B—B of FIG. 6a;

FIG. 9b is an energy band (conduction band bottom) diagram taken along line A—A of FIG. 9a;

FIG. 9c is an energy band (conduction band bottom) diagram taken along line B—B of FIG. 9a;

FIG. 13b is an energy band (conduction band bottom) diagram taken along line A—A of FIG. 13a;

FIG. 13c is an energy band (conduction band bottom) diagram taken along line B—B of FIG. 13a;

FIG. 15b is an energy band (conduction band bottom) diagram taken along line X—X of FIG. 15a;

FIG. 15c is an energy band (conduction band bottom) diagram taken along line Y—Y of FIG. 15a;

FIG. 16 is a schematic plan view of the quantum interference effect transistor of FIG. 15a;

FIG. 18b is an energy band (conduction band bottom) diagram taken along line X—X of FIG. 18a;

FIG. 18c is an energy band (conduction band bottom) diagram taken along line Y—Y of FIG. 18a;

FIG. 21b is an energy band (conduction band bottom) diagram taken along line X—X of FIG. 21a;

FIG. 21c is an energy band (conduction band bottom) diagram taken along line Y—Y of FIG. 21a;

DESCRIPTION OF THE PREFERRED EMBODIMENTS

Figure 1:
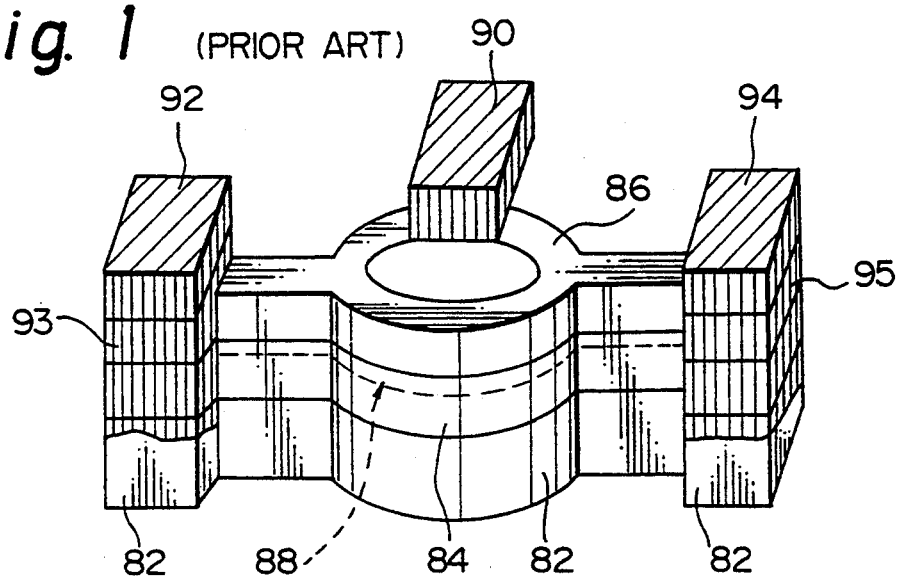
FIG. 1 is a schematic perspective view of a conventional quantum interference effect transistor with a ring.
Figure 2:
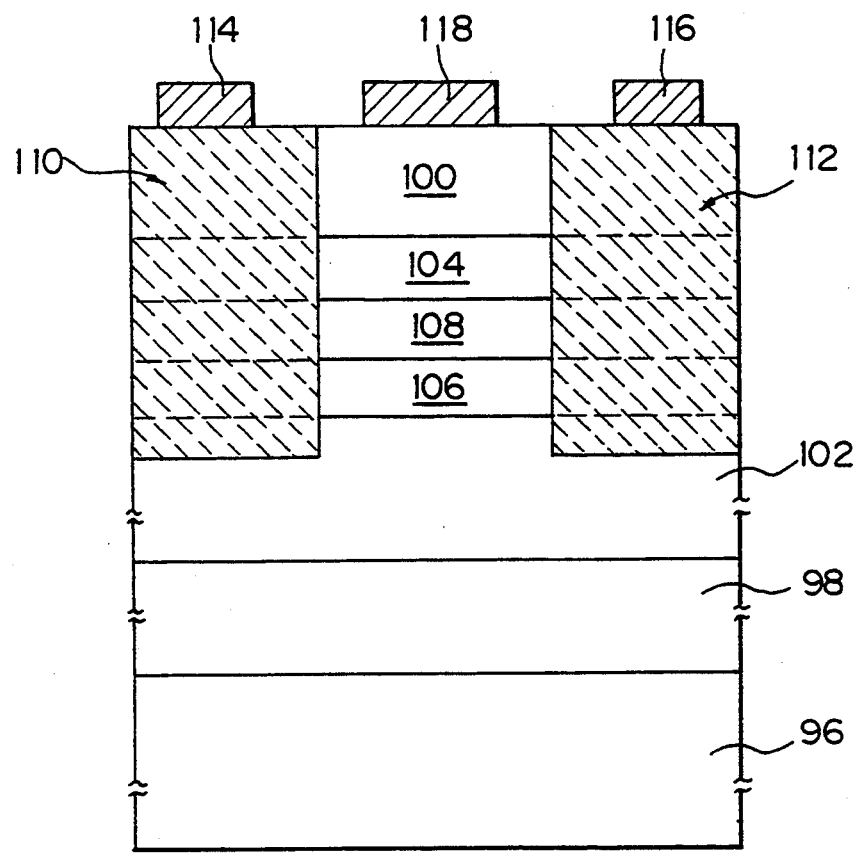
FIG. 2 is a schematic sectional view of another conventional quantum interference effect transistor provided with a separation layer between channel layers.
Figure 3:
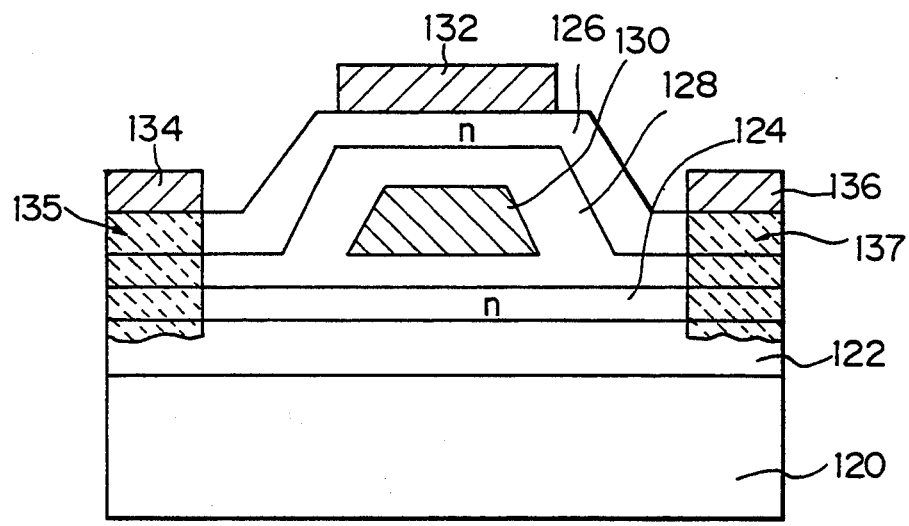
FIG. 3 is a schematic sectional view of still another conventional quantum interference effect transistor provided with an island-shape separation layer in a thick portion of a channel layer.
Figure 4:
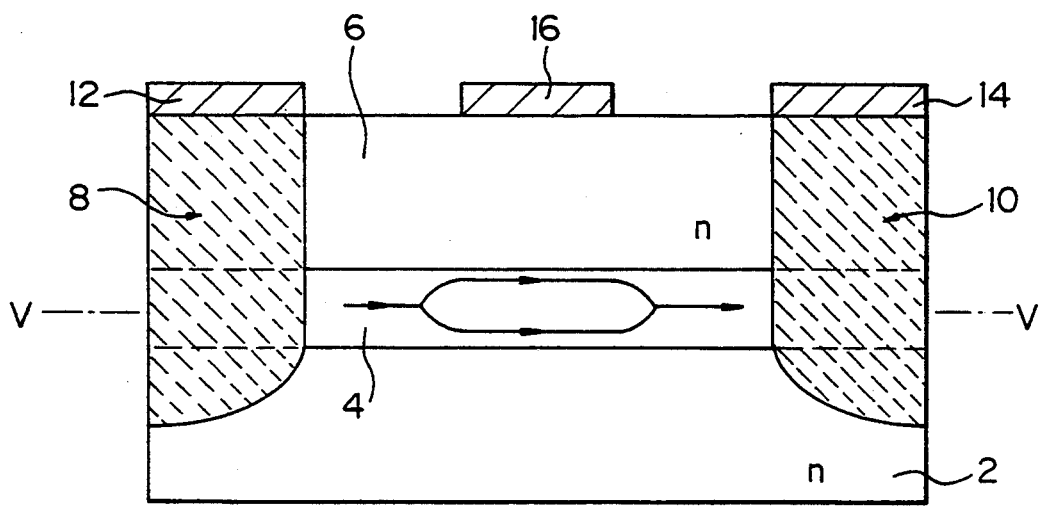
FIG. 4 is a schematic sectional view of a quantum interference effect transistor according to a principle of the present invention.

Referring to FIG. 4, a principle of a quantum interference effect transistor according to the present invention will now be explained.

As shown in FIG. 4, an n-type first semiconductor layer 2, a channel second semiconductor layer 4, and an n-type third semiconductor layer 6 are successively and epitaxially grown (formed) on a semiconductor substrate (not shown) to form a double hetero-structure. The second semiconductor layer 4 has an electron affinity larger than that of the first and third semiconductor layers 2 and 6, and the layers 2 and 6 are doped with n-type impurities (donor), so that electrons are induced in the second semiconductor layer 4 to form a two dimensional electron gas (2EDG).

A source region 8 and a region drain 10 are formed so as to extend to the first layer 2 from the surface of the third layer 6, apart from each other. A source electrode 12 and a drain electrode 14 are formed on the source region 8 and the drain region 10, respectively. Furthermore, a gate electrode 16 is formed on the third semiconductor layer 6 at the center of a space between the source and drain electrodes 12 and 14.

Where a two dimensional electron gas channel is generated in the channel second semiconductor layer 4 between the source region 8 and the drain region 10, according to the present invention, the channel consists of lead channel portions near the source and drain regions for one channel passage, and a middle channel portion below the gate electrode 16 which is divided into a first channel passage in proximity to a first interface between the first and second layers 2 and 4 and a second channel passage in proximity to a second interface between the second and third layers 4 and 6, as indicated with an arrow in FIG. 4. The two dimensional electron gas channel is divided into the two channel passage as explained hereinafter.

Figure 5A:
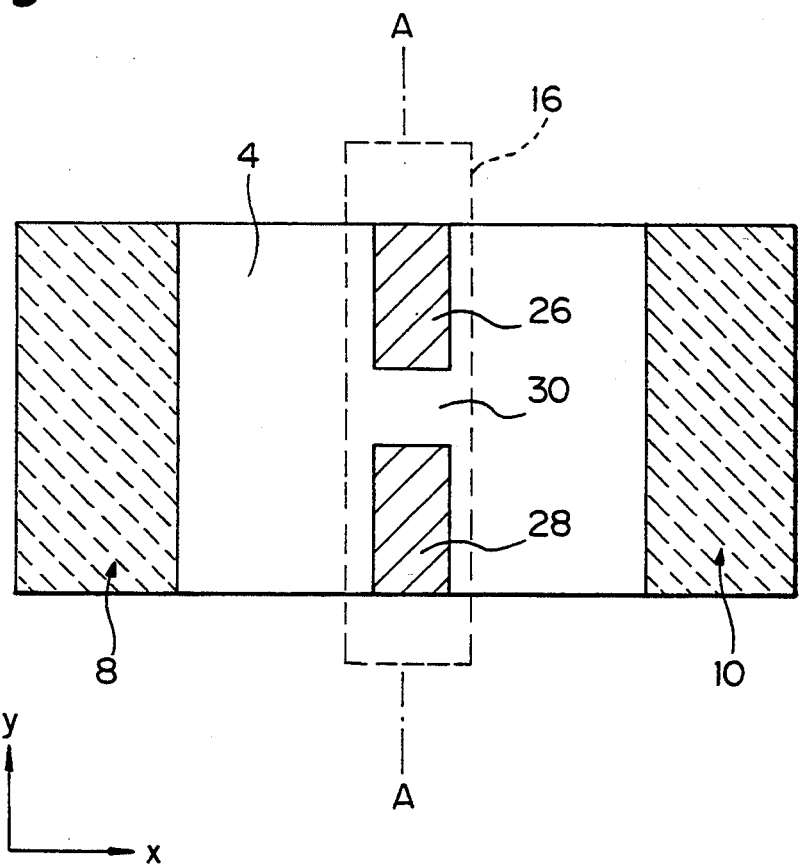
FIG. 5a is a schematic sectional view taken along line V—V of FIG. 4.
Figure 5B:
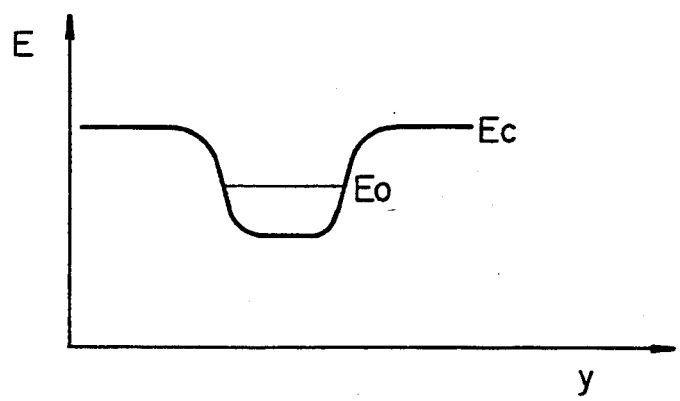

It is possible to additionally form a barrier region controlling the flow of the two dimensional electron gas to increase the interference effect, as shown in FIGS. 5a and 5b. FIG. 5a is a schematic sectional view taken along a line V—V of FIG. 4. In this case, the barrier region consists of two barrier regions 26 and 28 which are formed at least in the middle portion of the channel layer 4 below the gate electrode 16 and are arranged in a direction (y) at right angles to a channel direction (x) to form a slit portion 30 of the channel layer 4 therebetween. The barrier-regions 26 and 28 are formed by an ion-implantation process or a selective etching process. A width of the slit portion 30 (i.e., a distance between the barrier portions 26 and 28) is narrow enough to from a quantum well structure in the y-direction (e.g., from 10 nm to 50 nm). In the quantum well of the slit portion 30 of the channel layer 4, a sub-band Eo of electron is generated, as shown in FIG. 5b. Thus, the two electron gas generated in the channel layer 4 is quantized in the quantum well to form a one directional channel (i.e., to confine the electrons flowing through the slit portion 30 in the y-direction), whereby the interference effect is intensified.

First Embodiment

Figure 6A:
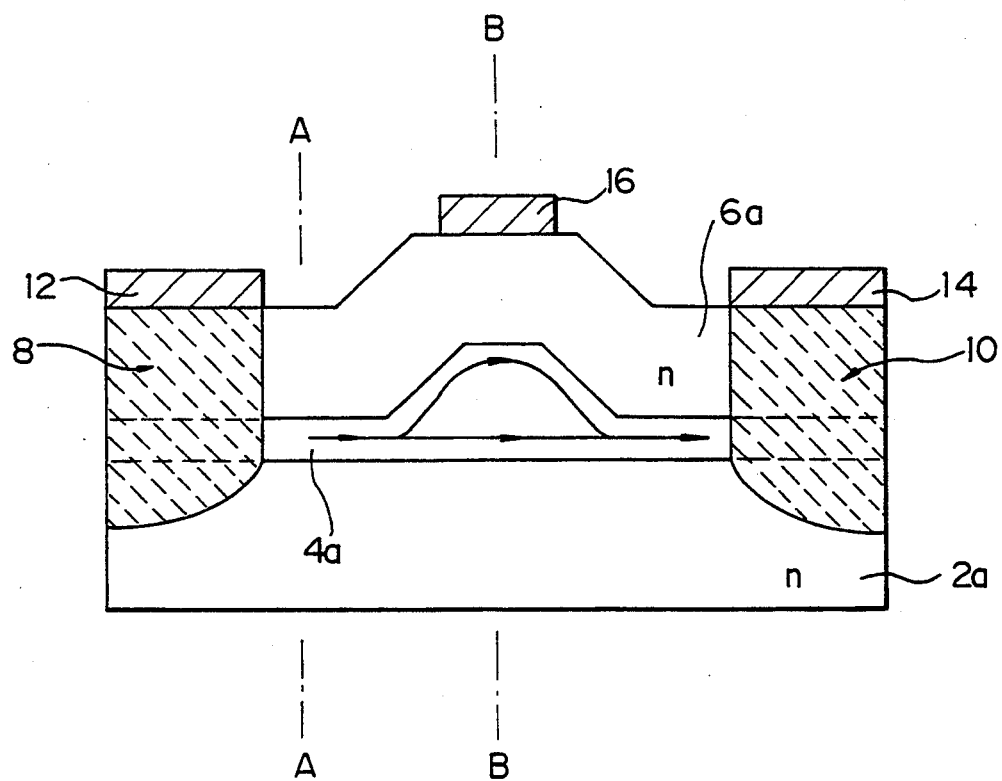
FIG. 6a is a schematic sectional view of a quantum interference effect transistor according to a first embodiment of the present invention.
Figures 6B, 6C:
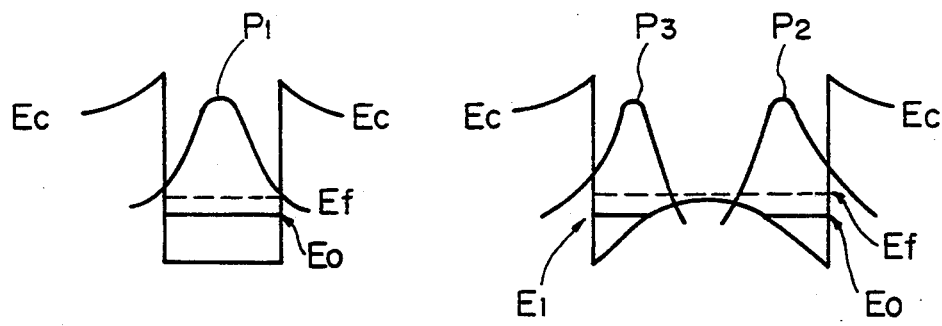

As shown in FIGS. 6a, 6b and 6c, a first quantum interference effect transistor comprises an n-type first semiconductor layer 2a, a channel second semiconductor layer 4a, an n-type third semiconductor layer 6a, a source region 8, a drain region 10, a source electrode 12, a drain electrode 14, and a gate electrode 16. The second semiconductor layer 4a interposed between the first and third semiconductor layers 2a and 6a includes a middle portion thicker than the rest (lead) portions near the source and drain regions 8 and 10. The first, second and third semiconductor layers 2a, 4a and 6a form a quantum well structure in a vertical direction.

Energy band diagrams for the three layers along a line A—A of FIG. 6a near the source region 8 and along a line B—B at the thick middle portion are obtained, as shown in FIGS. 6b and 6c, respectively.

As shown in FIG. 6b, near the source region 8 the lead portion of the channel second layer 4a is sufficiently thin to make a width of a quantum well of the layer 4a sufficiently small, so that the conduction band bottom Ec of the layer 4a has a small amount of bending and a sub-band Eo of electrons is generated under the Fermi energy level Ef through the layer 4a. In this case, an electron probability density distribution has a peak $P_1$ at a center thereof.

As shown in FIG. 6c, under the gate electrode 16, the middle portion of the channel second layer 4a is relatively thick to make a width of a quantum well of the layer 4a relatively wide, so that the conduction band bottom Ec of the layer 4a has a large amount of bending and sub-bands Eo and $E_1$ of electrons are generated under the Fermi energy level Ef near the first interface between the first and second layer 2a and 4a and near the second interface between the second and third layers 4a and 6a, respectively. In this case, an electron probability density distribution has two peaks $P_2$ and $P_3$ in proximity to the first interface and the second interface, respectively, and the distribution profile is divided into two parts. Accordingly, the two dimensional electron gas flows in two passages at the middle thick portion of the layer 4a.

Thus, in the channel second layer the two dimensional electron gas channel is divided into the two channel passages at the middle portion below the gate electrode 16 from one channel passage in the lead portion near the source region 8 and the channel passages then join each other in the lead portion near the drain region 10 to form one channel passage, in a wave-like manner. When a voltage is applied on the gate electrode 16 to vary an electron wave flowing through the upper one of the channel passages, a phase difference between the electron waves flowing through the lower and upper channel passages is caused so as to effectively generate an interference effect (the Aharonov-Bohm effect). Therefore, the modulation of the drain current of the quantum interference effect transistor can be improved.

EXAMPLE 1

Figure 7:
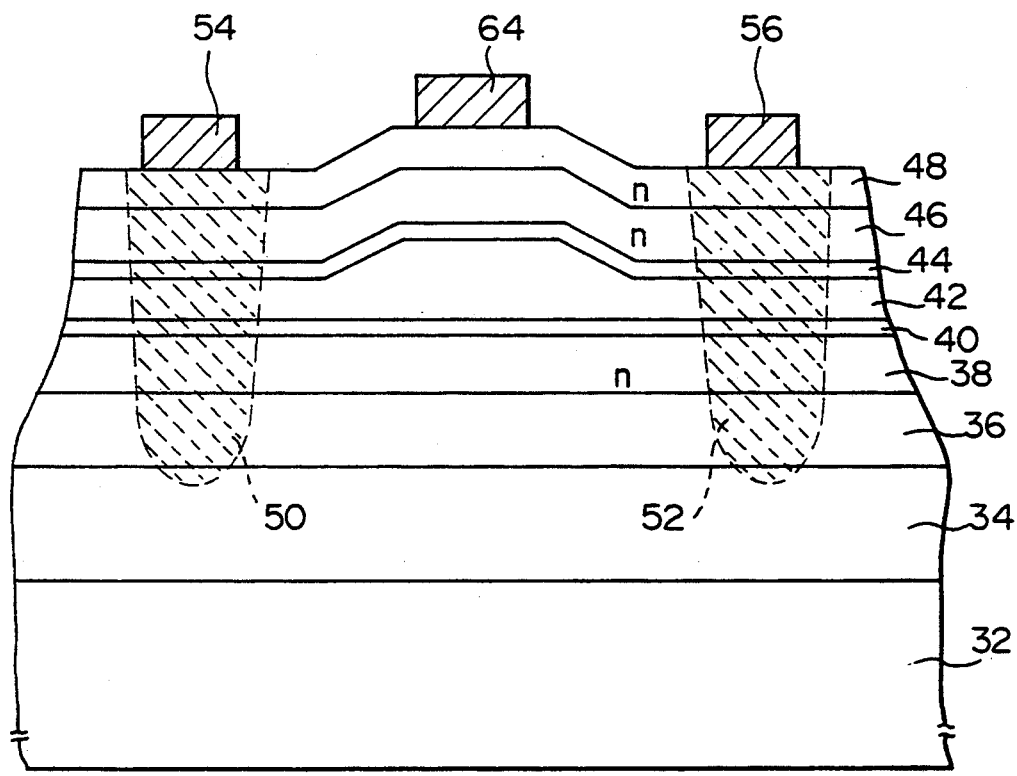
FIG. 7 is a schematic sectional view of a quantum interference effect transistor according to a first example of the present invention.
Figure 8:
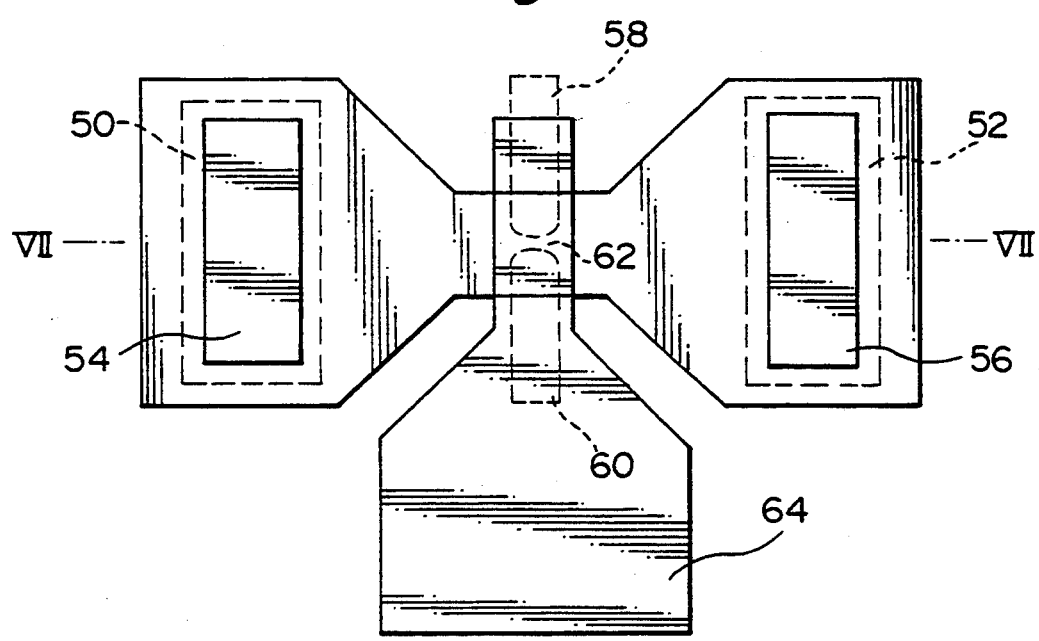
FIG. 8 is a schematic plan view of a quantum interference effect transistor of FIG. 7.

Referring to FIGS. 7 and 8, a first quantum interference effect transistor according to the first embodiment and a method of producing the same will now be explained.

As shown in FIG. 7, on a semi-insulating GaAs (single crystalline) substrate 32, an undoped GaAs buffer layer 34, an undoped AlGaAs buffer layer 36, an n-type AlGaAs (first semiconductor) layer 38, an undoped AlGaAs spacer layer 40 and an undoped GaAs channel layer 42 are successively and epitaxially grown by a molecular beam epitaxy (MBE) method or a metal organic chemical vapor deposition (MOCVD) method. The GaAs layer 34 has a thickness of 1 μm, the AlGaAs layer 36 has a thickness of 300 nm, and the doped AlGaAs layer 38 has a thickness of 20nm and an impurity concentration of $5 \times 10^{17}$ cm$^{-3}$. The spacer AlGaAs layer 40 has a thickness of 6 nm, and the channel GaAs layer 42 has a thickness of 50 nm. The channel GaAs layer 42 is selectively etched to thin it except for a middle portion having a length of 200 nm in a channel direction (x-direction), to 10 nm thickness by lithograph and etching processes Thus, the middle portion of the channel layer is thicker than the rest (lead) portions.

In the middle portion of the channel GaAs layer 42, as shown in FIG. 8, barrier regions 58 and 60 are formed by a focused ion beam implantation method in which Ga ions are introduced into the middle portion at an acceleration voltage of 100 keV and a dose of $1 \times 10^{14}$ cm$^{-2}$. The regions 58 and 60 have a width of 200 nm and are linearly arranged in a direction (y) at right angles to the channel direction apart from each other at a space (distance) of 50 nm. Thus, a slit portion 62 of the channel layer 42 has a width of 50 nm and a length of 200 nm.

After a cleaning step of the surface of the channel GaAs layer 42, an undoped spacer AlGaAs layer 44, an n-type AlGaAs (third semiconductor) layer 46 and an n-type GaAs layer 48 are successively and epitaxially grown on the GaAs layer 42 by an MBE method or an MOCVD method. The spacer AlGaAs layer 44 has a thickness of 6 nm, the AlGaAs layer 46 has a thickness of 100 nm and an impurity concentration of $5 \times 10^{17}$ cm$^{-3}$, and the GaAs layer 48 has a thickness of 10 nm and an impurity concentration of $1 \times 10^{18}$ cm$^{-3}$. The formed multilayer is then selectively etched to form a device portion having a mesa shape for a transistor.

A source electrode 54 and a drain electrode 56 are made of AuGe/Au and are formed on the n-type GaAs layer 48 above the thinner portions of the channel layer 42 apart from each other Then, an annealing (heat treatment) step is performed at a temperature of 450° C. for one minute to form alloying regions (i.e., a source region 50 and a drain region 52) extending in the buffer AlGaAs layer 36 through the channel layer 42. Accordingly, a two dimensional electron gas generated in the channel GaAs layer 42 comes into electrical contact with the electrodes 54 and 56 through the regions 50 and 52, respectively.

It is possible to form the barrier regions 58 and 60 by implanting Ga ions in the channel layer 42 through the layers 48, 46 and 44 by an focused ion beam implantation method.

Next, a gate electrode 64 of Al is formed on the GaAs layer 48 above the middle portion of the channel layer 42. Thus, the quantum interference effect transistor is obtained.

In this case, although the selective etching step of the channel layer 42 is performed in the course of the epitaxial growth of semiconductor layers, an exposed surface during the etching step is GaAs which is not easily oxidized, is not less contaminated with a carbon adhesion as compared with AlGaAs and is easily cleaned up. Therefore, formation of electron traps and scattering centers in the channel layer (electron wave channel) can be remarkably decreased.

Second Embodiment

Figure 9A:
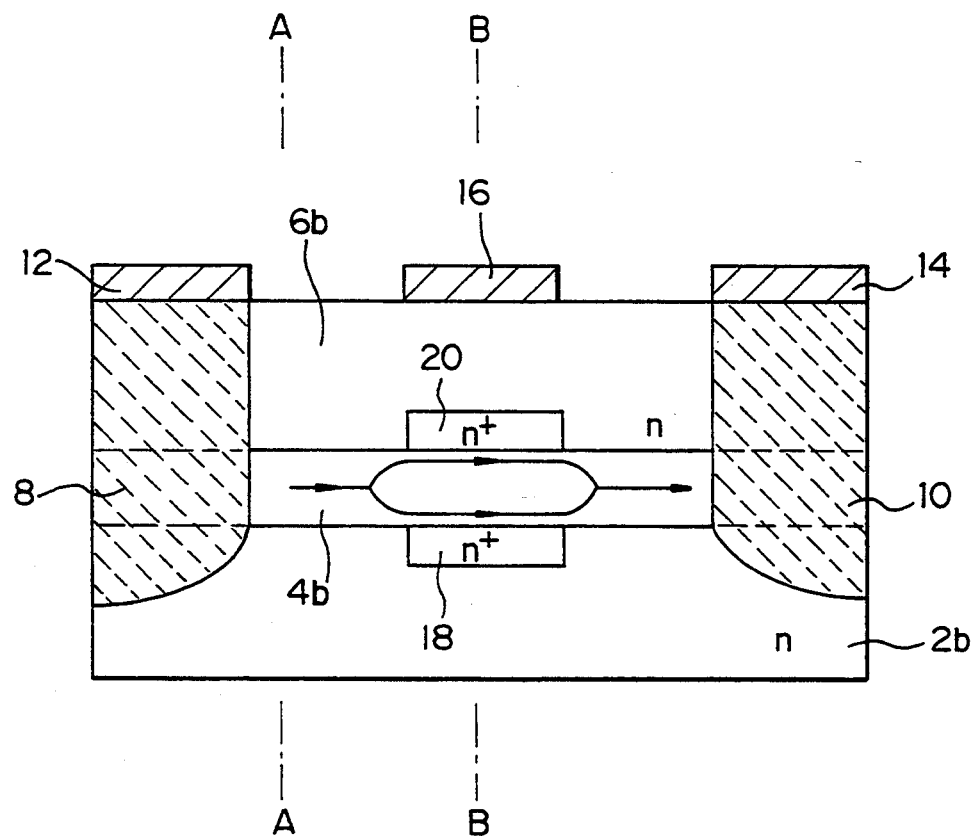
FIG. 9a is a schematic sectional view of a quantum interference effect transistor according to a second embodiment of the present invention.

As shown in FIG. 9a, a second quantum interference effect transistor is similar to the transistor of FIG. 4 except for additional formation of n-type impurity high concentration regions 18 and 20 which are formed in an n-type first semiconductor layer 2b and an n-type third semiconductor layer 6b below the gate electrode 16 and come into contact with a middle portion of a channel second layer 4b, respectively. It is possible to form one of the two high concentration regions 18 and 20 instead of the formation of both the regions 18 and 20. In practice, it is preferable to form the region 18 only.

Figure 9B:
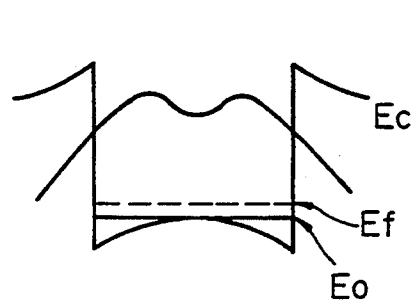
Figure 9C:
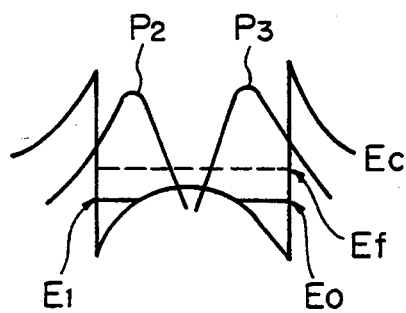

In this case, energy band diagrams for the three layers along a line A—A of FIG. 9a near the source region 8 and along a line B—B at below the gate electrode 16 are obtained, as shown in FIGS. 9b and 9c, respectively.

As shown in FIG. 9b, near the source region 8 a thickness of the channel layer 4b is thin enough to form a quantum well and an impurity concentrations of the n-type first and third semiconductor layers 2b and 6b is low, so that the conduction band bottom Ec of the layer 4b has a small amount of bending and a sub-band Eo of electrons is generated under the Fermi energy level Ff through the layer 4b. Although an electron probability distribution has two peaks, the distribution profile is not divided and the two peaks are considered as one peak with a recess. Namely, electrons concentrate at a center of the channel layer 4b. In this case, the thickness of the layer 4b is larger than that of the layer 4a of FIGS. 6a and 6b.

As shown in FIG. 9c, below the gate electrode 16, the n-type regions 18 and 20 set on both sides of the middle portion of the channel layer 4b have a high impurity concentration, so that the conduction band bottom Ec of the layer 4b has a large amount of bending and subbands Eo and $E_1$ of electrons are generated under the Fermi energy level Ef near the first interface between the first and second layer 2b and 4b and near the second interface between the second and third layers 4b and 6b, respectively. In this case, an electron probability density distribution has two peaks $P_2$ and $P_3$ in proximity to the first interface and the second interface, respectively, and the distribution profile is divided into two parts. Accordingly, the two dimensional electron gas flows in two passages at the middle portion of the layer 4b.

Thus, in the channel second layer the two dimensional electron gas channel is divided into the two channel passages at the middle portion below the gate electrode 16 from one channel passage in the lead portion near the source region 8 and the channel passages then join each other in the lead portion near the drain region 10 to form one channel passage, in a wave-like manner. When a voltage is applied to the gate electrode 16 to vary an electron wave flowing through the upper one of the channel passages, a phase difference between the electron waves flowing through the lower and upper channel passages is caused so as to effectively generate an interference effect (the Aharonov-Bohm effect). Therefore, the modulation of the drain current of the quantum interference effect transistor can be improved.

EXAMPLE 2

Figure 10:
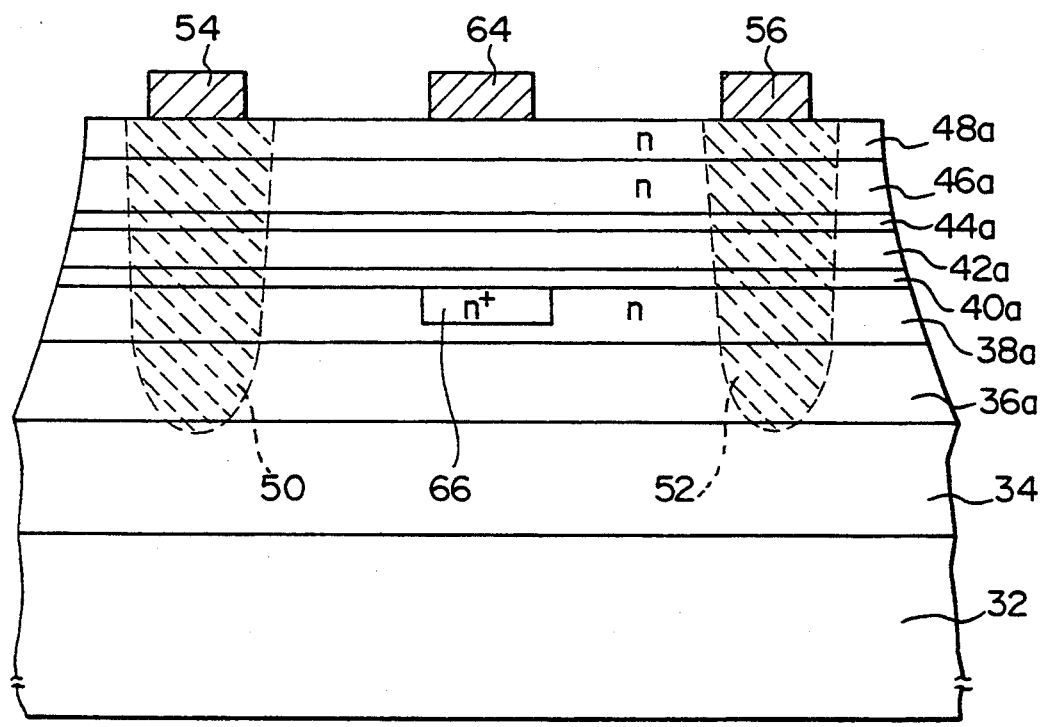
FIG. 10 is a schematic sectional view of a quantum interference effect transistor according to a second example of the present invention.

Referring to FIG. 10, a second quantum interference effect transistor according to the second embodiment and a method of producing the same are now explained. Reference numerals in FIG. 10 being the same as those used in FIG. 7 indicate the same parts or similar parts of the transistor of FIG. 7.

As shown in FIG. 10, on a semi-insulating GaAs substrate 32, an undoped GaAs layer 34, an undoped AlGaAs buffer layer 36a and an n-type AlGaAs (first semiconductor) layer 38a are successively and epitaxially grown by an MBE method or an MOCVD method. The GaAs layer 34 has a thickness of 1 $\mu$m, the AlGaAs layer 36a has a thickness of 600 nm, and the doped AlGaAs layer 38 has a thickness of 20 nm and an impurity concentration of $5 \times 10^{16}$ cm$^{-3}$. Then, an n$^+$-type impurity doped region 66 being a line with a width of 200 nm is formed in a middle portion of the layer 38a by a focused ion beam implantation method in which Si ions are introduced into the middle portion at an acceleration voltage of from 10 to 40 keV and a dose of $1 \times 10^{12}$/cm$^2$. The substrate is transferred from an epitaxial growing apparatus to an ion implanter and vice versa under an ultra-high vacuum condition.

An undoped spacer AlGaAs layer 40a, an undoped GaAs channel layer 42a, an undoped spacer AlGaAs layer 44a, an n-type AlGaAs (third semiconductor) layer 46a and an n-type GaAs layer 48a are successively and epitaxially grown on the AlGaAs layer 38a by an MBE method or an MOCVD method. The spacer AlGaAs layer 40a has a thickness of 10 nm, the channel layer 42a has a thickness of 40 nm, the spacer AlGaAs layer 44a has a thickness of 10 nm, the AlGaAs layer 46a has a thickness of 70 nm and an impurity concentration of $5 \times 10^{17}$ cm$^{-3}$, and the GaAs layer 48a has a thickness of 10 nm and an impurity concentration of $1 \times 10^{18}$ cm$^{-3}$. The formed multilayer is then selectively etched to form a device portion having a mesa shape for a transistor.

A source electrode 54 and a drain electrode 56 of AuGe/Au are formed on the n-type GaAs layer 48 apart from each other. Then, an annealing (heat treatment) step is performed to form alloying regions (i.e., a source region 50 and a drain region 52) extending in the buffer AlGaAs layer 36a through the channel layer 42a in the same manner as that of Example 1.

Next, a gate electrode 64 of Al is formed on the GaAs layer 48 above the middle portion of the channel layer 42a . Thus, the second quantum interference effect transistor is obtained.

It is possible to form the barrier regions 58 and 60 mentioned in the example 1 in at the channel layer 42a.

Furthermore, it is possible to additionally form an n$^+$-type impurity doped region (not shown) in the n-type AlGaAs layer 46a above the region 66. In this case, the impurity concentration of the layer 46a is lowered to $5 \times 10^{16}$ cm$^{-3}$ being similar to that of the layer 38a.

In this example, there is no selective etching step during the epitaxial growth of the layers. The epitaxial growth can control a layer thickness with a high accuracy and can form both the lower and upper surfaces of the channel layer without fluctuation, which lowers scattering effect to suppress disorder of an electron wave mode.

Third Embodiment

Figure 11:
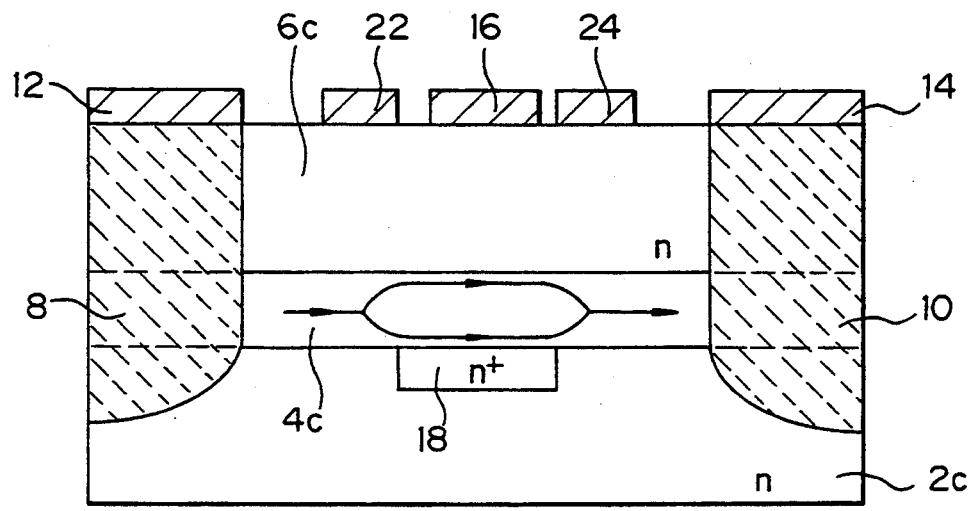
FIG. 11 is a schematic sectional view of a quantum interference effect transistor according to a third embodiment of the present invention.

As shown in FIG. 11, a third quantum interference effect transistor is similar to the transistor of FIG. 4 except for additional formation of an n-type impurity high concentration region 18 in an n-type first semiconductor layer 2c under the gate electrode 16 and additional formation of channel control electrodes 22 and 24 which are formed on an n-type third semiconductor layer 6c and arranged between the source electrode 12 and the gate electrode 16 and between the gate electrode 16 and the drain electrode 14, respectively. The first semiconductor layer 2c is lightly doped and the third semiconductor layer 6c is doped larger than the layer 2c. The n-type region 18 is the same as the region 18 of FIG. 9a.

In this case, near the source region 8 (or the drain region 10), a peak in the electron probability distribution exists in a channel second layer 4c in proximity to a second interface between the second and third semiconductor layers. Under the channel control electrode 22 (or 24), a predetermined voltage is applied to the control electrode 22 (or 24) to decrease a bending of the conduction band bottom Ec of the channel second semiconductor layer 4c, so that the peak is shifted to the center of the layer 4c. Furthermore, below the gate electrode 16, due to the n-type impurity high concentration region 18, the electron probability distribution profile in the middle portion of the channel layer 4c is divided into two parts so as to generate two peaks near a first interface between the first and second layers 2c and 4c and near the second interface, respectively. Thus, a quantum interference effect appears in a similar manner to that of the second embodiment.

EXAMPLE 3

Figure 12:
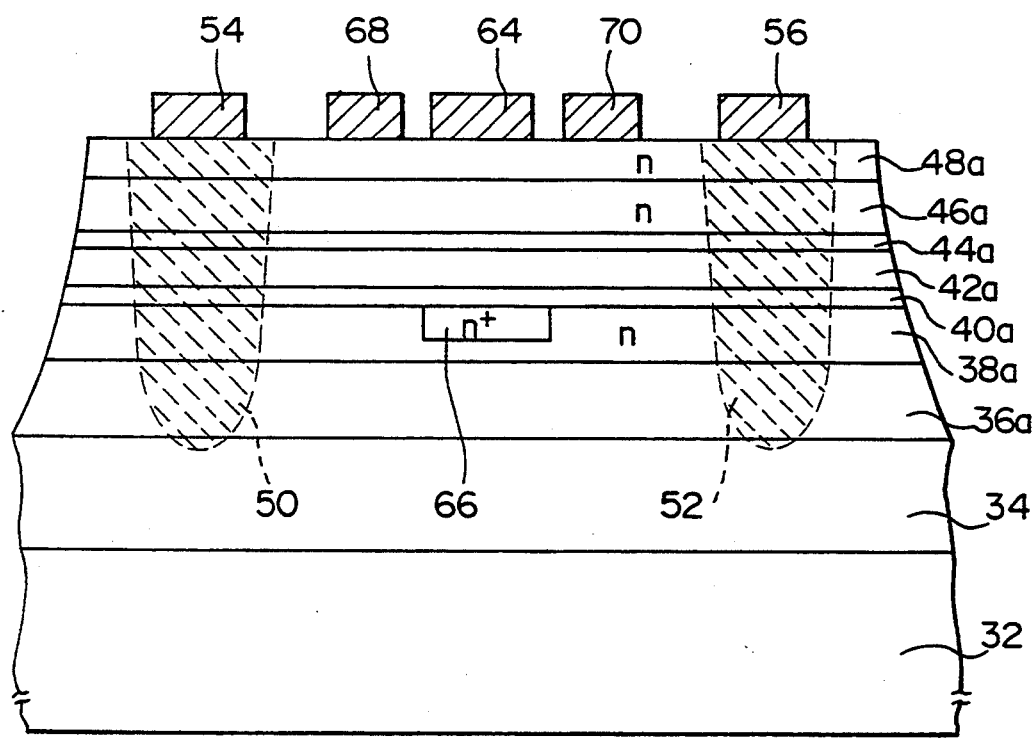
FIG. 12 is a schematic sectional view of a quantum interference effect transistor according to a third example of the present invention.

Referring to FIG. 12, a third transistor is the almost same as the second transistor of FIG. 10 except that the channel control electrodes 68 and 70 of Al are set on the n-type GaAs layer 48a on both sides of the gate electrode 64. Reference numerals in FIG. 12 being the same as those used in FIG. 10 indicate the same parts or similar parts of the transistor of FIG. 10. The third transistor is produced in the almost same manner as that explained in Example 2. The channel control electrodes 68 and 70 of Al are formed simultaneously together with the gate electrode 64.

Fourth Embodiment

Figure 13A:
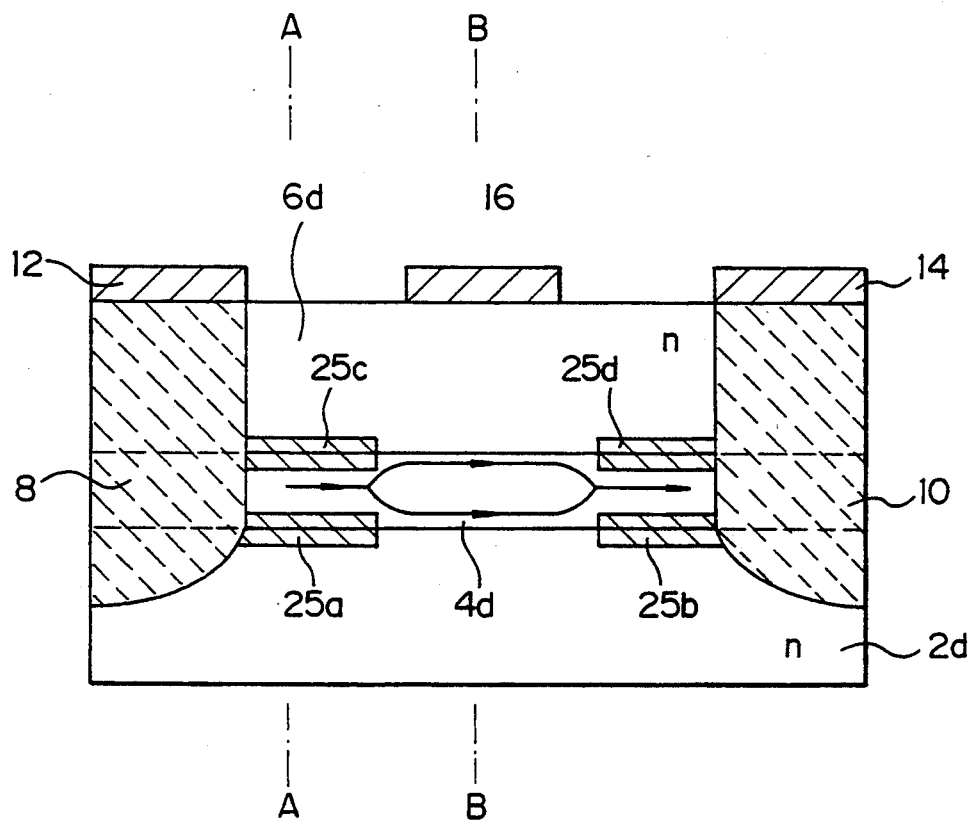
FIG. 13a is a schematic sectional view of a quantum interference effect transistor according to a fourth embodiment of the present invention.
Figures 13B, 13C:
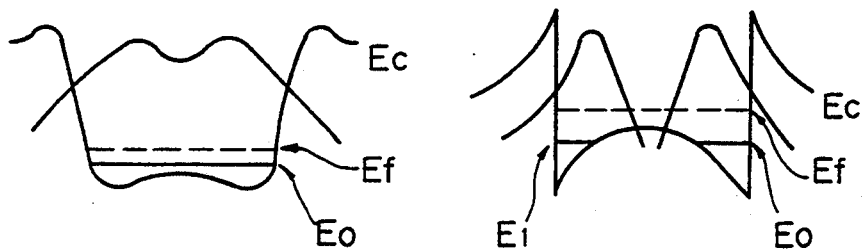

As shown in FIG. 13a, a fourth quantum interference effect transistor is similar to the transistor of FIG. 4 except for additional formation of conversion regions 25a, 25b, 25c, and 25d which are formed at four heterointerface portions between the first and second semiconductor layers 2d and 4d and between the second and third semiconductor layers 4d and 6d near the source and drain regions 8 and 10, respectively. The conversion regions 25a, 25b, 25c and 25d provide sloping connection lines between the conduction band bottoms of the first and second semiconductor layers 2d and 4d and between the conduction band bottoms of the second and third semiconductor layers 4d and 6d, as shown in FIG. 13b. In the fourth transistor, the channel second semiconductor layer 4d has a thickness similar to that of the thick middle portion of the channel layer 4a of FIG. 6a, or the first and third semiconductor layers with high concentration regions 18 and 20 have impurity concentrations similar to those of the n-type impurity high concentration regions 18 and 20 of FIG. 9a.

In this case, energy band diagrams for the three layers along a line A—A of FIG. 13a near the source region 8 and along a line B—B at below the gate electrode 16 are obtained, as shown in FIGS. 13b and 13c, respectively.

As shown in FIG. 13b, near the source region 8, the conversion regions 25a and 25c formed at the interfaces make slopes connecting the conduction band bottoms Ec of the first and second semiconductor layers 2d and 4d and of the second and third semiconductor layers 4d and 6d. Accordingly, the conduction band bottom Ec of the layer 4d has a small amount of bending and a subband Eo of electrons in generated under the Fermi energy level Ff through the layer 4d. Although an electron probability distribution has two peaks, the distribution profile is not divided and the two peaks are considered as one peak with a recess. Namely, electrons concentrate at a center of the channel layer 4d.

As shown in FIG. 13c, below the gate electrode 16, the middle portion of the channel second layer 4d is relatively thick as mentioned in the first embodiment, or the concentration of the first and third semiconductor layers 2d and 6d are relatively high as mentioned in the second embodiment, so that the conduction band bottom Ec of the layer 4d has a large amount of bending and sub-bands Eo and $E_1$ of electrons are generated under the Fermi energy level Ef near the first interface between the first and second layer 2d and 4d and near the second interface between the second and third layers 4d and 6d, respectively. In this case, an electron probability density distribution has two peaks $P_2$ and $P_3$ in proximity to the first interface and the second interface, respectively, and the distribution profile is divided into two parts. Accordingly, the two dimensional electron gas flows in two passages at the middle portion of the layer 4b.

Thus, in the channel second layer the two dimensional electron gas channel is divided into the two channel passages at the middle portion below the gate electrode 16 from one channel passage in the lead portion near the source region 8 and the channel passages then join each other in the lead portion near the drain region 10 to form one channel passage, in a wave-like manner. When a voltage is applied on the gate electrode 16 to vary an electron waves flowing through the upper one of the channel passages, a phase difference between the electron waves flowing through the lower and upper channel passages is caused so as to effectively generate an interference effect (the Aharonov-Bohm effect). Therefore, the modulation of the drain current of the quantum interference effect transistor can be improved.

EXAMPLE 4

Referring to FIGS. 14a to 14d, a fourth quantum interference effect transistor according to the fourth embodiment and a method of producing the same will now be explained. Reference numerals in FIGS. 14a to 14e which are the same as those used in FIGS. 7 and 10 indicate the same parts or similar parts of the transistors of FIGS. 7 and 10.

Figure 14A:
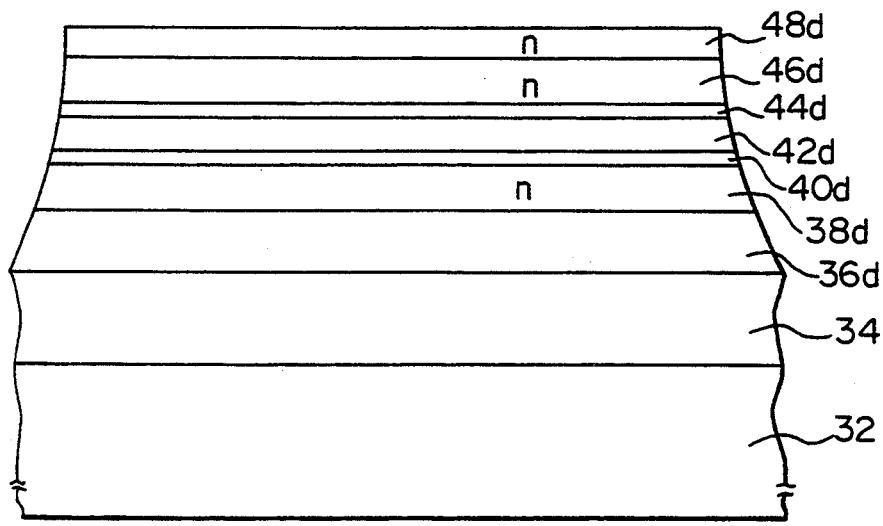
FIG. 14a to 14d are schematic sectional views of a quantum interference effect transistor according to a fourth example of the present invention in various stages of its production.

As shown in FIG. 14a, on a semi-insulating GaAs substrate 32, an undoped GaAs layer 34, an undoped AlGaAs buffer layer 36d, an n-type AlGaAs (first semiconductor) layer 38d, an undoped spacer AlGaAs layer 40d, an undoped GaAs channel layer 42d, an undoped spacer AlGaAs layer 44d, an n-type AlGaAs (third semiconductor) layer 46d and an n-type GaAs layer 48d are successively and epitaxially grown by an MBE method of an MOCVD method. The GaAs layer 34 has a thickness of 1 μm, the AlGaAs layer 36d has a thickness of 300 nm, and the doped AlGaAs layer 38d has a thickness of 30 nm and an impurity concentration of $1 \times 10^{18}$ cm$^{-3}$. The spacer AlGaAs layer 40d has a thickness of 20 nm, the channel layer 42d has a thickness of 40 nm, the spacer AlGaAs layer 44d has a thickness of 20nm, the AlGaAs layer 46d has a thickness of 20nm and an impurity concentration of $1 \times 10^{18}$ cm$^{-3}$, and the GaAs layer 48d has a thickness of 10 nm and an impurity concentration of $1 \times 10^{18}$ cm$^{-3}$. Then, the formed multilayer is selectively etched to form a device portion having a mesa shape for a transistor.

Figure 14B:
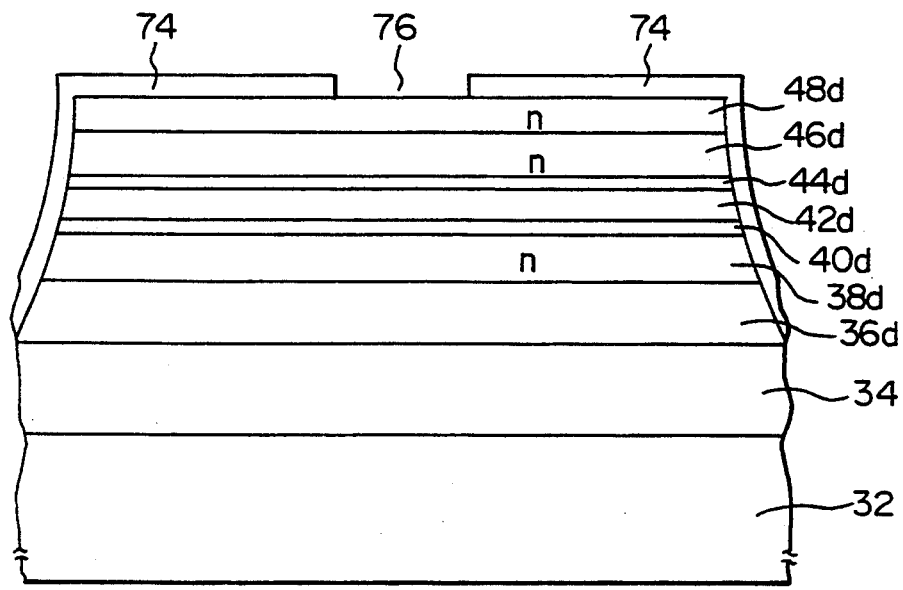

As shown in FIG. 14b, a dielectric layer (e.g., SiO$_2$ layer) 74 gettering Ga is deposited over the entire surface and then is selectively etched to form an opening 76 corresponding to a gate electrode area. A thickness of the layer 74 is 200 nm and a width of the opening 76 is from 0.5 to 1 μm.

Figure 14C:
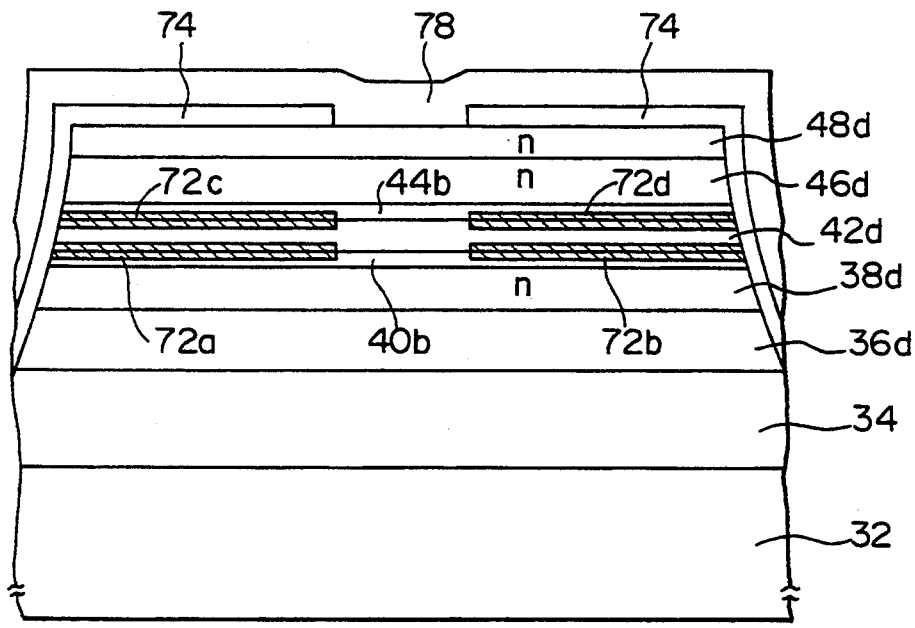

As shown in FIG. 14c, a protecting layer (e.g., AlN layer) 78 for preventing Ga and As from dissociation is deposited over the entire surface. Then, an annealing (heat treatment) is performed at a temperature of 900°

C. for a period of 256 seconds with the result that the SiO$_2$ layer 74 generates a thermal stress in the n-type GaAs layer 48d and getters Ga to induce vacancies of Ga flowing through in the channel GaAs layer 42d under the layer 74. Thus, under the SiO$_2$ layer 74, at the hetero-interfaces between the AlGaAs layer 38d and the channel GaAs layer 42d and between the layer 42d and the AlGaAs layer 46d, Ga atoms and Al atoms thermally interdiffuse to vary the composition ratios of the interface portions of the GaAs layer 42d and the AlGaAs layers 38d and 46d, so that the conversion regions 72a to 72d having a thickness of 5 to 7 nm, respectively. Each of the conversion regions changes the interface of the conduction band bottoms from a vertical line (FIG. 13c) to a sloping line (FIG. 13b). Under the AlN layer 78 within the opening 76, interface portions are not changed.

Figure 14D:
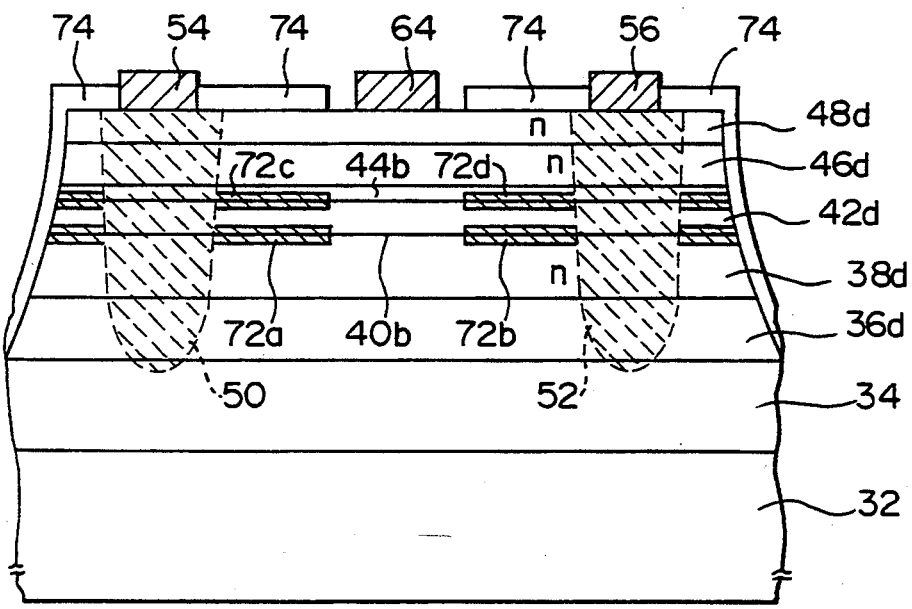

Next, the AlN layer 78 is removed and the SiO$_2$ layer 74 is selectively etched to form openings for source and drain electrode areas apart from each other. Then, as shown in FIG. 14d, a source electrode 54 and a drain electrode 56 of AuGe/Au are formed on the n-type GaAs layer 48d in the openings and above the conversion regions. Then, an annealing (heat treatment) step is performed to form alloying regions (i.e., a source region 50 and a drain region 52) extending in the buffer AlGaAs layer 36d through the channel layer 42d and the conversion regions in the same manner as that of the example 1. A gate electrode 64 of Al is formed on the GaAs layer 48d in the opening 76 and above the middle portion of the channel layer 42d. Thus, the fourth quantum interference effect transistor is obtained.

It is possible to form the barrier regions 58 and 60 mentioned in the example 1 in at least the channel layer 42d.

Furthermore, it is possible to use a Si$_x$O$_{1-x}$ layer or as the dielectric layer, instead of the SiO$_2$ layer, and to use a SiN$_y$ layer as the protective layer, instead of the AlN layer.

In this example, the transistor adopts a combination of the thick channel layer (40 nm thick) and the high impurity concentration (of $1 \times 10^{18}$ cm$^{-3}$) of the AlGaAs layers 38d and 46d. It is also possible to adopt one of the two factors, so as to divide the two dimensional electron gas channel into the two channel passages at the middle portion of the channel layer 42b.

Fifth Embodiment

Figure 15A:
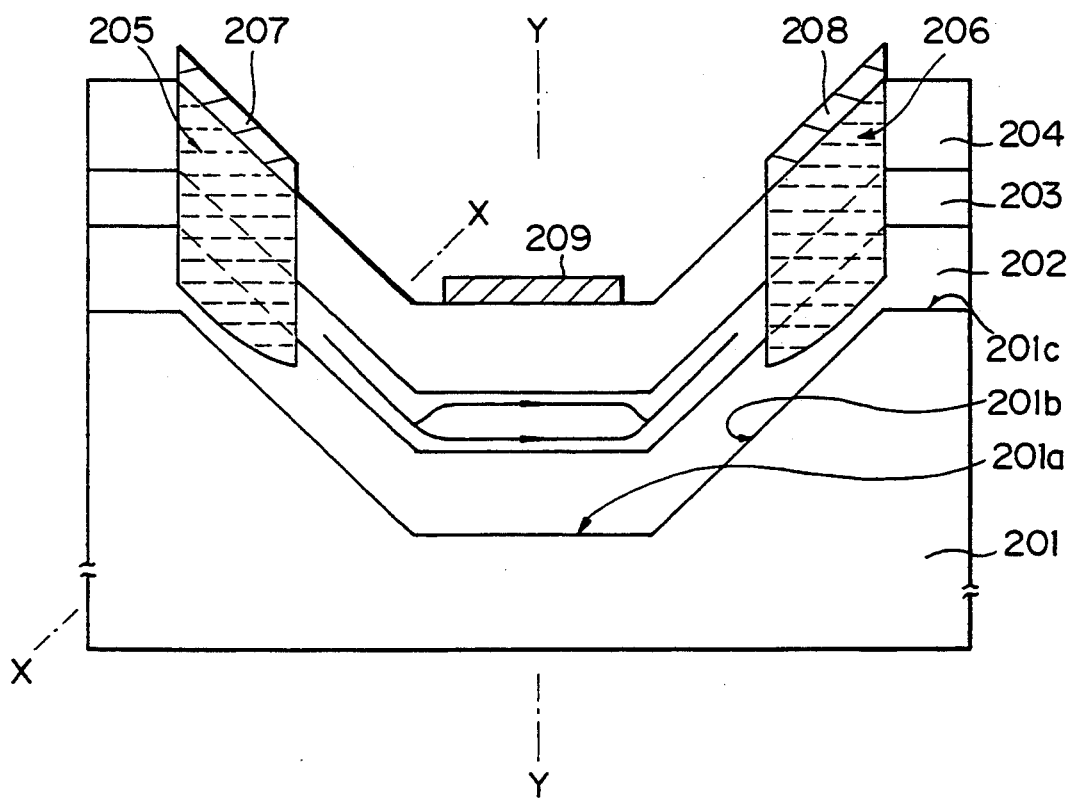
FIG. 15a is a schematic sectional view of a quantum interference effect transistor with a groove according to a fifth embodiment of the present invention.
Figure 16:
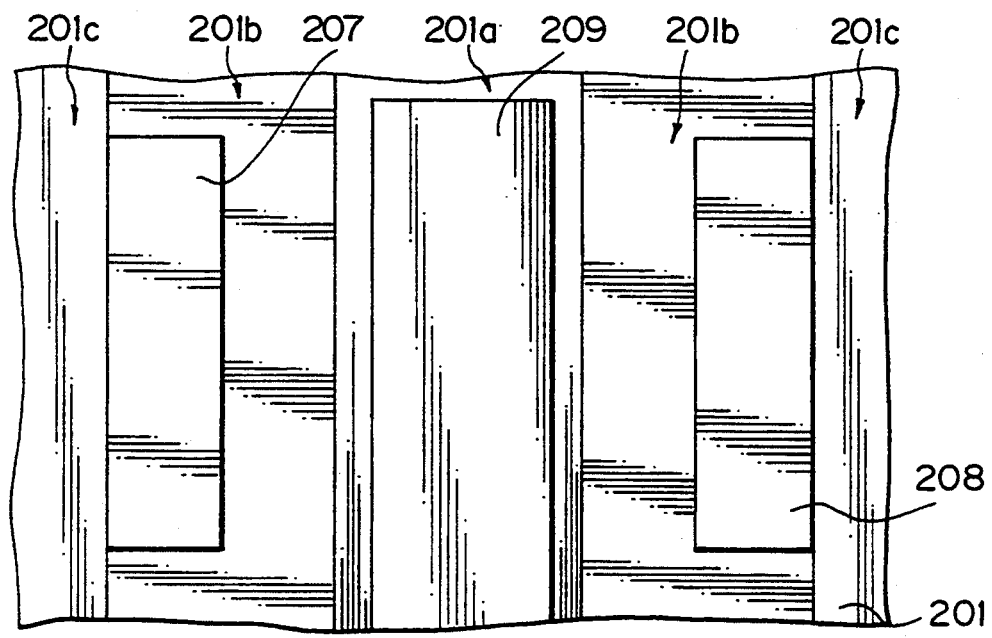

As shown in FIGS. 15a and 16, a fifth quantum interference effect transistor comprises a semiconductor substrate 201 having a groove of an inverted isosceles trapezoid, an n-type first semiconductor layer 202, a channel second semiconductor layer 203, an n-type third semiconductor layer 204, a source region 205, a drain region 206, a source electrode 207, a drain electrode 208, and a gate electrode 209. The groove is formed by anisotropically etching the substrate 201 with e.g., (100) plane, so as to have a bottom flat surface 201a, and two slope (side) surfaces 201b of e.g., (111)A plane. Thus, the original surface of the substrate remains as top flat surfaces 201c. Where each of the first, second and third semiconductors 202, 203 and 204 is epitaxially formed, each of the layers consists of a thicker middle portion of the bottom 201a, thinner lead portions on the slopes 201b and thicker portions on the top surfaces 201c. A thickness of the lead portions is about 70% of that of the middle portion.

The source electrode 207 and the drain electrode 208 are set on the slope surfaces of the third layer 204 and the gate electrode 209 is set on the groove bottom of the layer 204, as shown in FIG. 16.

Since the second semiconductor layer 203 has an electron affinity larger than that of the first and third semiconductor layers 202 and 204, and the layers 202 and 204 are n-type, electrons are induced in the second layer 203 and form a two dimensional electron gas. The electrons flow from the source region 205 to the drain region 206 to form a channel. The first, second and third semiconductor layers 202, 203 and 204 form a quantum well structure, and depending on the thickness of the second layer 203, the layer 204 forms a quantum well at the bottom portion larger than another quantum well at the slope position, as shown in FIGS. 15b and 15c.

Figure 15B:
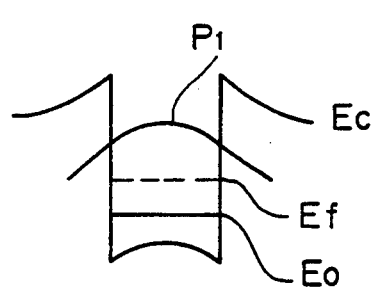
Figure 15C:
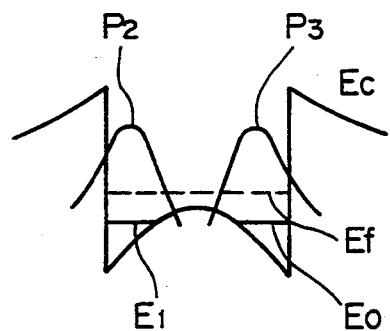

Energy band diagrams of a quantum well for the three layers along a line X—X of FIG. 15a at the slope portion and along a line Y—Y at the bottom portion are obtained, as shown in FIGS. 15b and 15c, respectively.

As shown in FIG. 15b, at the slope near the source region 205 the slope (lead) portion of the channel second layer 203 is sufficiently thin to make a width of a quantum well sufficiently small, so that the conduction band bottom Ec of the layer 203 has a small amount of bending and a sub-band Eo of electrons is generated under the Fermi energy level Ef through the layer 203. In this case, an electron probability density distribution has a peak P$_1$ at a center thereof.

As shown in FIG. 15c, under the gate electrode 209 and at the groove bottom, the middle portion of the channel second layer 203 is relatively thick to make a width of a quantum well relatively wide, so that the conduction band bottom Ec of the layer 203 has a large amount of bending and sub-bands Eo and E$_1$ of electrons are generated under the Fermi energy level Ef near the first interface between the first and second layer 202 and 203 and near the second interface between the second and third layers 203 and 204, respectively. In this case, an electron probability density distribution has two peaks P$_2$ and P$_3$ in proximity to the first interface and the second interface, respectively, and the distribution profile is divided into two parts. Accordingly, the two dimensional electron gas flows in two passages at the middle thick portion of the layer 203.

Thus, in the channel second layer the two dimensional electron gas channel is divided into the two channel passages at the middle portion below the gate electrode 209 from one channel passage in the slope (lead) portion near the source region 205 and the channel passages then join each other in the slope (lead) portion near the drain region 206 to form one channel passage, in a wave-like manner. When a voltage is applied to the gate electrode 209 to vary an electron wave flowing through the upper one of the channel passages, a phase difference between the electron waves flowing through the lower and upper channel passages is caused so as to effectively generate an interference effect (the Aharonov-Bohm effect). Therefore, the modulation of the drain current of the quantum interference effect transistor can be improved.

EXAMPLE 5

Figure 17:
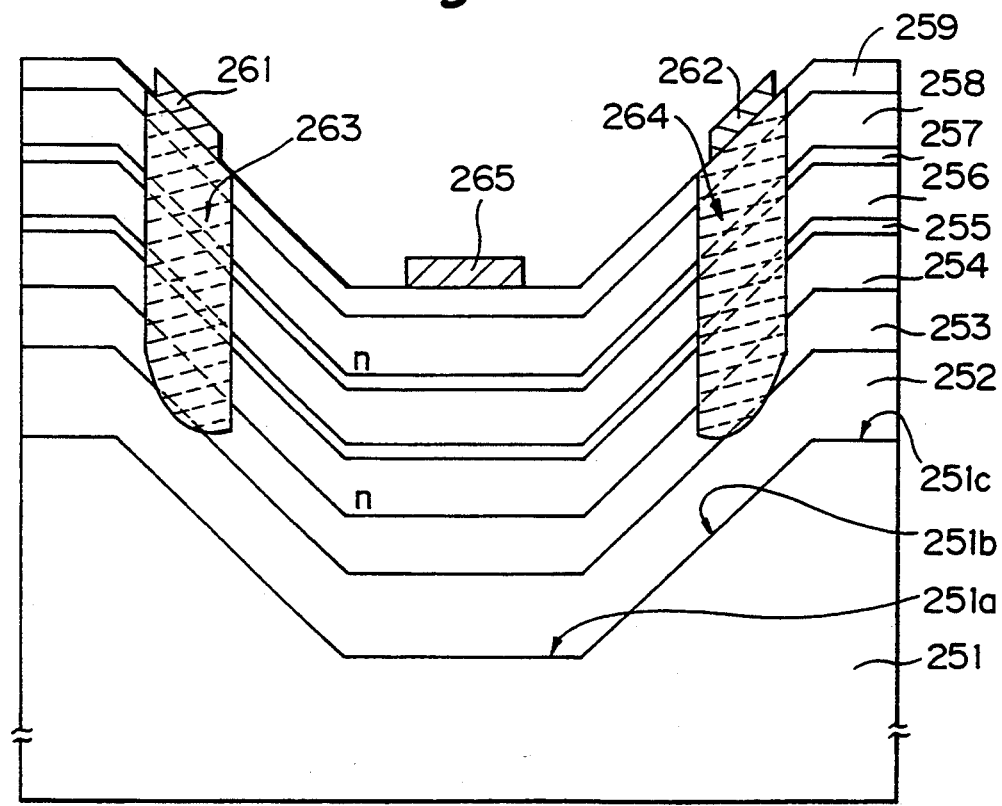
FIG. 17 is a schematic sectional view of a quantum interference effect transistor with a groove according to a fifth example of the present invention.

Referring to FIG. 17, a fifth quantum interference effect transistor according to the fifth embodiment and a method of producing the same will now be explained.

A resist layer (not shown) is formed on a semi-insulating GaAs (100) substrate 251 with a flat surface 251c, exposed and developed to form a resist pattern of lines. Using the pattern as a mask, the substrate 251 is anisotropically etched by using an etching solution of $H_3PO_4$: $H_2O_2$ =1: 10 at 11° C. to form a groove of an inverted isosceles trapezoid, as shown in FIG. 17. The groove has bottom flat surface 251a of (100) plane and slopes 251b of (111)A plane making an angle of 55° with the (100) plane. The resist pattern is then removed.

As shown in FIG. 17, on the substrate 251 with the groove, an undoped GaAs layer 252, an undoped AlGaAs buffer layer 253, an n-type AlGaAs (first semiconductor) layer 254, and undoped spacer AlGaAs layer 255, an undoped GaAs channel layer 256, an undoped spacer AlGaAs layer 257, an n-type AlGaAs (third semiconductor) layer 258 and an n-type GaAs layer 259 are successively and epitaxially grown by an MBE method or an MOCVD method. The GaAs layer 252 has a thickness of 1 μm, the AlGaAs layer 253 has a thickness of 300 nm, and the doped AlGaAs layer 254 has a thickness of 20 nm and an impurity concentration of $1 \times 10^{17}$ cm$^{-3}$. The spacer AlGaAs layer 255 has a thickness of 6nm, the channel layer 256 has a thickness of 50 nm, the spacer AlGaAs layer 257 has a thickness of 6 nm, the AlGaAs layer 258 has a thickness of 100 nm and an impurity concentration of $1 \times 10^{17}$ cm$^{-3}$, and the GaAs layer 259 has a thickness of 10 nm and an impurity concentration of $1 \times 10^{18}$ cm$^{-3}$. The mentioned thicknesses are obtained at the flat portions of the layers on the top and bottom flat surfaces. The slope portions of each of the formed layers has a thickness of 70% of the above-mentioned values.

In the epitaxial growth of the MBE method, silicon is used as an n-type impurity for obtaining a high quality crystal, a substrate temperature is 540° C. and a ratio of As/Ga in molecular beams is from 14 to 16, preferably 15. Although the silicon serves as an amphoteric impurity at the (111)A plane of the slopes, the above-mentioned conditions make not only the flat (100) plane but also the slope (111)A plane n-type.

A source electrode 261 and a drain electrode 262 are made of AuGe/Au and are formed on the slopes of the n-type GaAs layer 259. Then, an annealing (heat treatment) step is performed at a temperature of 450° C. for one minute to form alloying regions (i.e., a source region 263 and a drain region 264) extending in the buffer AlGaAs layer 253 through the channel layer 256. Accordingly, a two dimensional electron gas generated in the channel GaAs layer 256 comes into electric contact with the electrodes 261 and 262 through the regions 263 and 264, respectively.

Next, a gate electrode 265 of Al is formed on the bottom surface of the GaAs layer 259 above the middle portion of the channel layer 256. Thus, the quantum interference effect transistor is obtained.

It is possible to form the barrier regions mentioned in the example 1 in at least the channel layer 256.

Sixth Embodiment

Figure 18A:
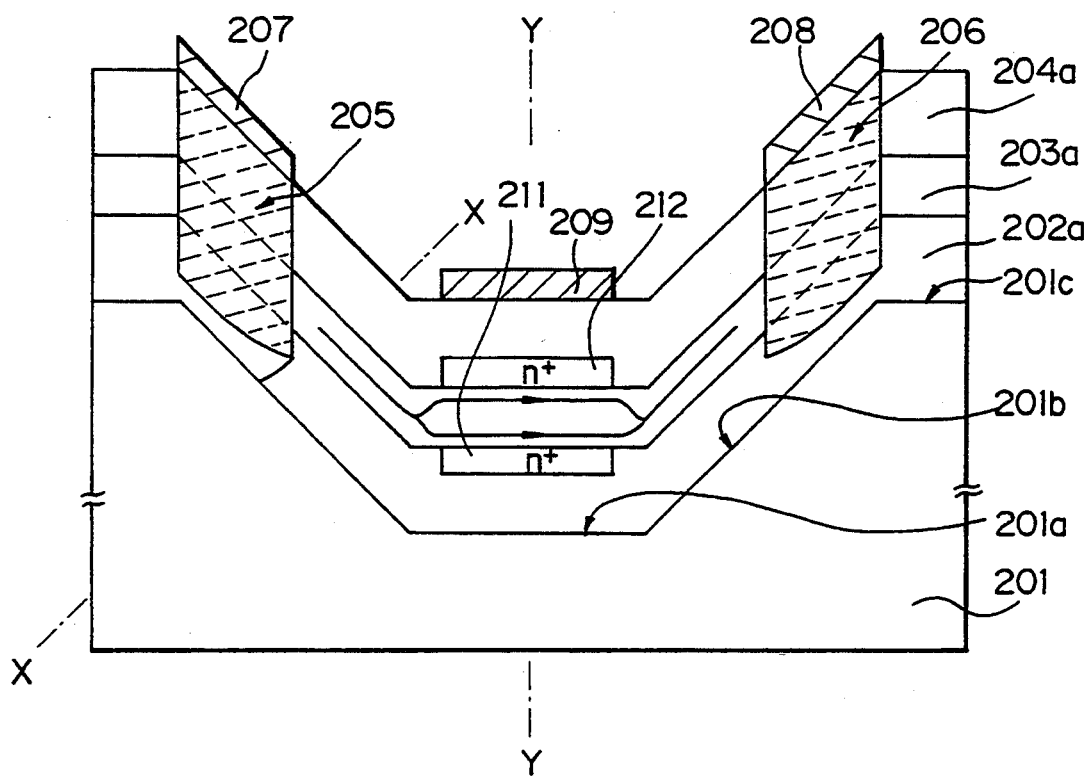
FIG. 18a is a schematic sectional view of a quantum interference effect transistor with a groove according to a sixth embodiment of the present invention.

As shown in FIG. 18a, a sixth quantum interference effect transistor is similar to the transistor of FIG. 15a except for additional formation of n-type impurity high concentration regions 211 and 212 below the gate electrode 209, which regions are formed in groove bottom portions of an n-type first semiconductor layer 202a and an n-type third semiconductor layer 204a and come into contact with a channel second layer 203a, respectively. The sixth embodiment is based on a combination of the second and fifth embodiments. It is possible to form one of the two high concentration regions 211 and 212 instead of the formation of both the regions 211 and 212. In practice, it is preferable to form the region 211 only.

Figure 18B:
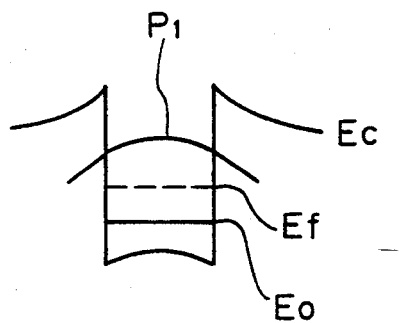
Figure 18C:
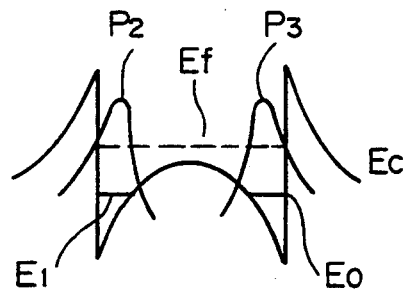

In this case, energy band diagrams of quantum well for the three layers along a line X—X of FIG. 18a at the slope portion and along a line Y—Y at the bottom portion are obtained, as shown in FIGS. 18b and 18c, respectively.

As shown in FIG. 18b, the conduction band bottom Ec of the layer 203a has a small amount of bending and a sub-band Eo of electrons is generated under the Fermi energy level Ef through the layer 203a, and an electron probability density distribution has a peak $P_1$ at a center thereof, in the same manner as those of FIG. 15b of the fifth embodiment.

As shown in FIG. 18c, below the gate electrode 209, the n-type regions 211 and 212 set on both sides of the middle thick portion of the channel layer 203a have a high impurity concentration, so that the conduction band bottom Ec of the layer 203a has a large amount of bending and sub-bands Eo and $E_1$ of electrons are generated under the Fermi energy level Ff near the first interface between the first and second layers 203a and 204a, respectively. In this case, an electron probability density distribution has two peaks $P_2$ and $P_3$ in proximity to the first interface and the second interface, respectively, and the distribution profile is divided into two parts larger than FIG. 15c. Accordingly, the two dimensional electron gas flows in two passages at the middle portion of the layer 203a. Thus, the obtained channel is the almost same as the two dimensional electron gas channel of the fifth embodiment.

Seventh Embodiment

Figure 19:
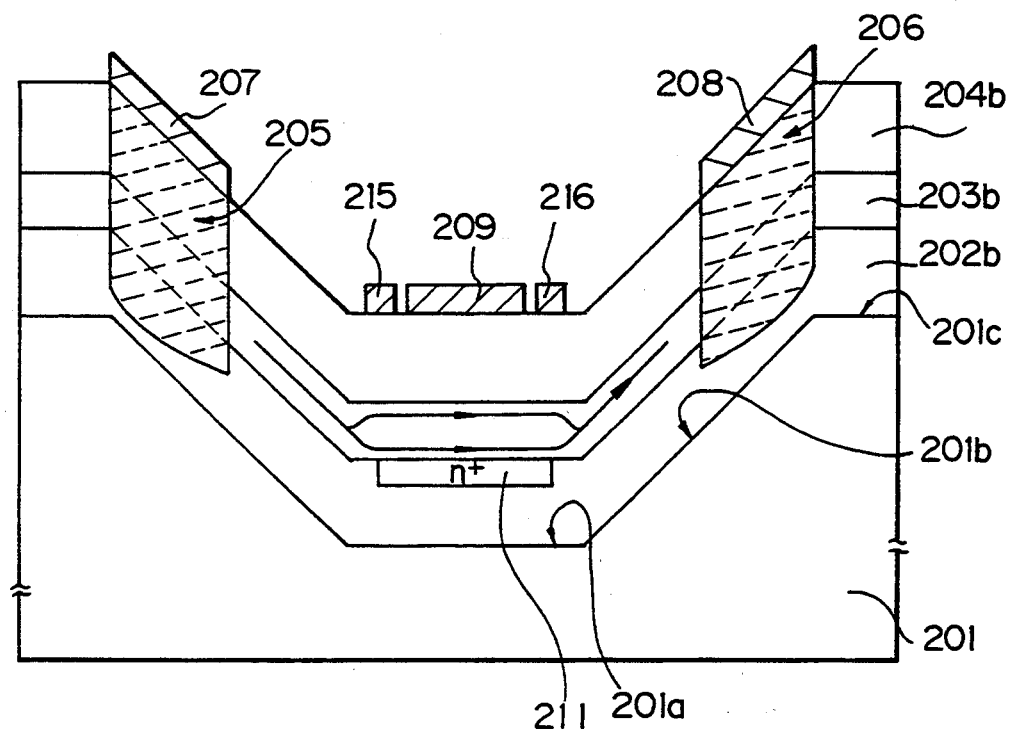
FIG. 19 is a schematic sectional view of a quantum interference effect transistor with a groove according to a seventh embodiment of the present invention.

As shown in FIG. 19, a seventh quantum interference effect transistor is similar to the transistor of FIG. 15a except for additional formation of an n-type impurity high concentration region 211 in a groove bottom portion of an n-type first semiconductor layer 203b under the gate electrode 16 and additional formation of channel control electrodes 215 and 216 which are formed on an n-type third semiconductor layer 204b and arranged between the source electrode 207 and the gate electrode 209 and between the gate electrode 209 and the drain electrode 208, respectively. The first semiconductor layer 202b is lightly doped and the third semiconductor layer 204b is doped larger than the layer 202b. The n-type region 211 is the same as the region 211 of FIG. 18a. The seventh embodiment is based on a combination of the third and fifth embodiments.

In this case, at slope portions, a peak in the electron probability distribution exists in the channel second layer 203b in proximity to a second interface between the second and third semiconductor layers 203b and 204b. Under the channel control electrode 215 (or 216), a predetermined voltage is applied to the control electrode 215 (or 216) to decrease a bending of the conduction band bottom Ec of the channel second semiconductor layer 203b, so that the peak is shifted to a center of the layer 203b. Furthermore, below the gate electrode 209, due to the n-type impurity high concentration region 211, the electron probability distribution profile in the middle portion of the channel layer 203b is divided into two parts so as to generate two peaks near a first interface between the first and second layers 202b and 203b and near the second interface, respectively. Thus, an quantum interference effect appears in a similar manner to that of the sixth embodiment.

EXAMPLE 6

Figure 20:
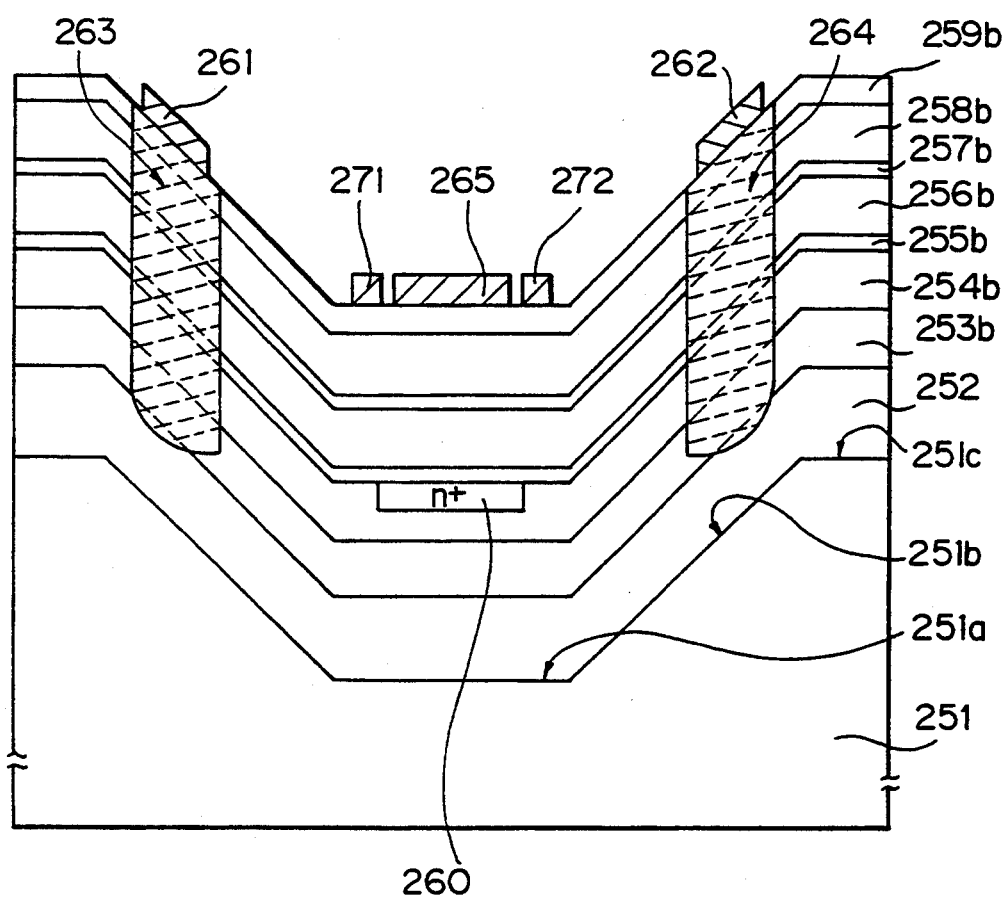
FIG. 20 is a schematic sectional view of a quantum interference effect transistor with a groove according to a sixth example of the present invention.

Referring to FIG. 20, a sixth quantum interference effect transistor according to the seventh embodiment and a method of producing the same will now be explained. Reference numerals in FIG. 20 being the same as those used in FIG. 17 indicate the same parts or similar parts of the transistor of FIG. 17.

As explained in the example 5, a resist pattern is formed on a flat semi-insulating GaAs (100) substrate 251, and an uncoated portion of the substrate is anisotropically etched with the etching solution of $H_3PO_4$ and $H_2O_2$ at 11° C. to form a groove of an inverted isosceles trapezoid, as shown in FIG. 20. The groove has bottom flat surface 251a of (100) plane and slopes 251b of (111)A plane making an angle of 55° with the (100) plane. The resist pattern is then removed.

On the semi-insulating substrate 251 with the groove, an doped GaAs 252, an undoped AlGaAs buffer layer 253, and an n-type AlGaAs (first semiconductor) layer 254b are successively and epitaxially grown by an MBE method. The GaAs layer 252 has a thickness of 1 μm, the AlGaAs layer 253 has a thickness of 300 nm, and the doped AlGaAs layer 254b has a thickness of 20 nm and an impurity concentration of $5 \times 10^{16}$ cm$^{-3}$.

Then, an n+-type impurity doped region 260 being a line with a width of 200 nm is formed in a groove bottom portion (middle portion) of the layer 254b by a focused ion beam implantation method in which Si ions are introduced into the middle portion at an acceleration voltage of from 10 to 40 key and a dose of $1 \times 10^{12}$ /cm$^2$. The substrate is transferred from an epitaxial growing apparatus to an ion implanter and vice versa under an ultra-high vacuum condition.

Next, on the doped layer 254b, an undoped spacer AlGaAs layer 255b, an undoped GaAs channel layer 256b, an undoped spacer AlGaAs layer 257b, an n-type AlGaAs (third semiconductor) layer 258b and an n-type GaAs layer 259b are successively and epitaxially grown by an MBE method at a substrate temperature of 540° C. and a ratio of As/Ga of 15. The spacer AlGaAs layer 255b has a thickness of 10 nm, the channel layer 256 has a thickness of 30nm, the spacer AlGaAs layer 257b has a thickness of 10nm, the AlGaAs layer 258b has a thickness of 100 nm and an impurity concentration of $1 \times 10^{18}$ cm$^{-3}$, and the GaAs layer 48d has a thickness of 10 nm and an impurity concentration of $1 \times 10^{18}$ cm$^{-3}$. The mentioned thicknesses are obtained at the flat portions of the layers on the top and bottom flat surfaces. The slope portions of each of the formed layers has a thickness of 70% of the above-mentioned values.

A source electrode 261 and a drain electrode 262 of AuGe/Au are formed on the slopes of the n-type GaAs layer 259b. Then, an annealing (heat treatment) step is performed to form alloying regions (i.e., a source region 263 and a drain region 264) extending in the buffer AlGaAs layer 253b through the channel layer 256b in the same manner as that of the example 5.

Next, a gate electrode 265 of Al is formed on the groove bottom surface of the GaAs layer 259b above the middle portion of the channel layer 256b. At the same time, two channel control electrodes 271 and 272 of Al are formed on the groove bottom surface of the layer 259b on both side of the gate electrode 265. Thus, the quantum interference effect transistor is obtained.

It is possible to form the barrier regions mentioned in the example 1 in at least the channel layer 256b.

Eighth Embodiment

Figure 21A:
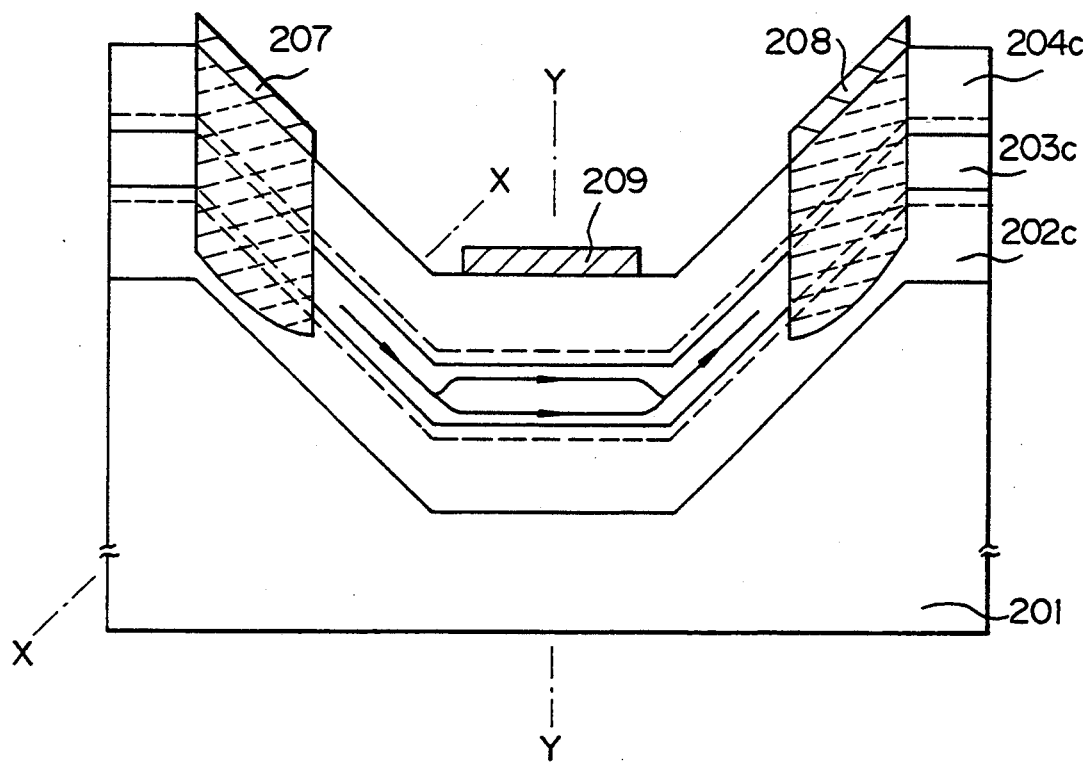
FIG. 21a is a schematic sectional view of a quantum interference effect transistor with atomic-plane doped layers according to an eighth embodiment of the present invention.

As shown in FIG. 21a, an eighth quantum interference effect transistor is similar to the fifth transistor of FIG. 15a, except that each of n-type first and third semiconductor layers 202c and 204c is formed by growing an undoped semiconductor layer and doping it with impurities by an atomic-plane doping method (i.e., a δ-functional doping method), instead of a growth of an uniformly doped semiconductor layer. Such a doping method increases a range of doped impurity concentration.

Where an undoped GaAs layer is sandwiched with uniformly doped AlGaAs layers, for dividing an electron wave into two portions, an impurity concentration (doping concentration) of $5 \times 10^{17}$ cm$^{-3}$ restricts a thickness of the GaAs layer (i.e., a quantum well width) within a range of from 45 to 59 nm. Since a thickness of the GaAs layer on a slope is about 70% of that on the flat surface, a thickness of the slope portion of the GaAs layer (i.e., a quantum well at the slope) is from 32 to 35 nm. The latter quantum well width can prevent the electron wave from being divided, but it is preferably to narrow the quantum well width to increase an efficiency of the quantum interference. If the quantum well width at the slope is decreased, the quantum well width at the flat surface is also decreased, which may prevent the electron wave from being divided. In such a case, the impurity concentration of the AlGaAs layers is increased to promote the division of the electron wave.

Figure 21B:
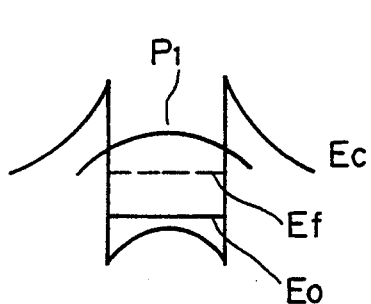
Figure 21C:
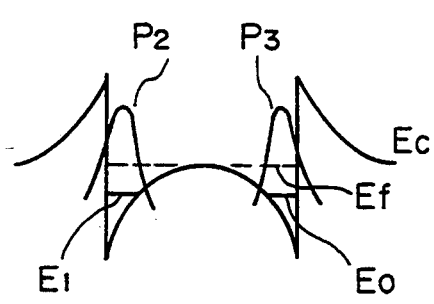

Energy band diagrams of quantum well for the three layers along a line X—X of FIG. 21a at the slope portion and along a line Y—Y at the groove bottom portion are obtained, as shown in FIGS. 21b and 21c.

As shown in FIG. 21b, the conduction band bottom Ec of the channel layer 203c has a bending larger that of FIG. 15b, and a sub-band Eo of electron is generated under the Fermi energy level Ef through the layer 203c.

As shown in FIG. 21c, the conduction band bottom Ec of the layer 203c has a larger amount of bending as compared with FIGS. 15c and 18c and sub-bands Eo and E₁ of electrons are generated under the Fermi energy level Ff near the first interface between the first and second layers 203c and 204c, and the second interface between the second and third layers 203c and 204c, respectively. In this case, an electron probability density distribution has two peaks P₂ and P₃ in proximity to the first interface and the second interface, respectively, and the distribution profile is divided into two parts larger than FIG. 15c. Accordingly, the two dimensional electron gas flows in two passage at the middle portion of the layer 203c. Thus, the obtained channel is the almost same as the two dimensional electron gas channel of the fifth embodiment.

The bendings of FIGS. 21b and 21c are caused by a high impurity concentration of the atomic-plane doped layers 202c and 204c.

The atomic-plane doping technique is also applied to the first and/or third semiconductor layers of the above-mentioned embodiments.

EXAMPLE 7

Figure 22:
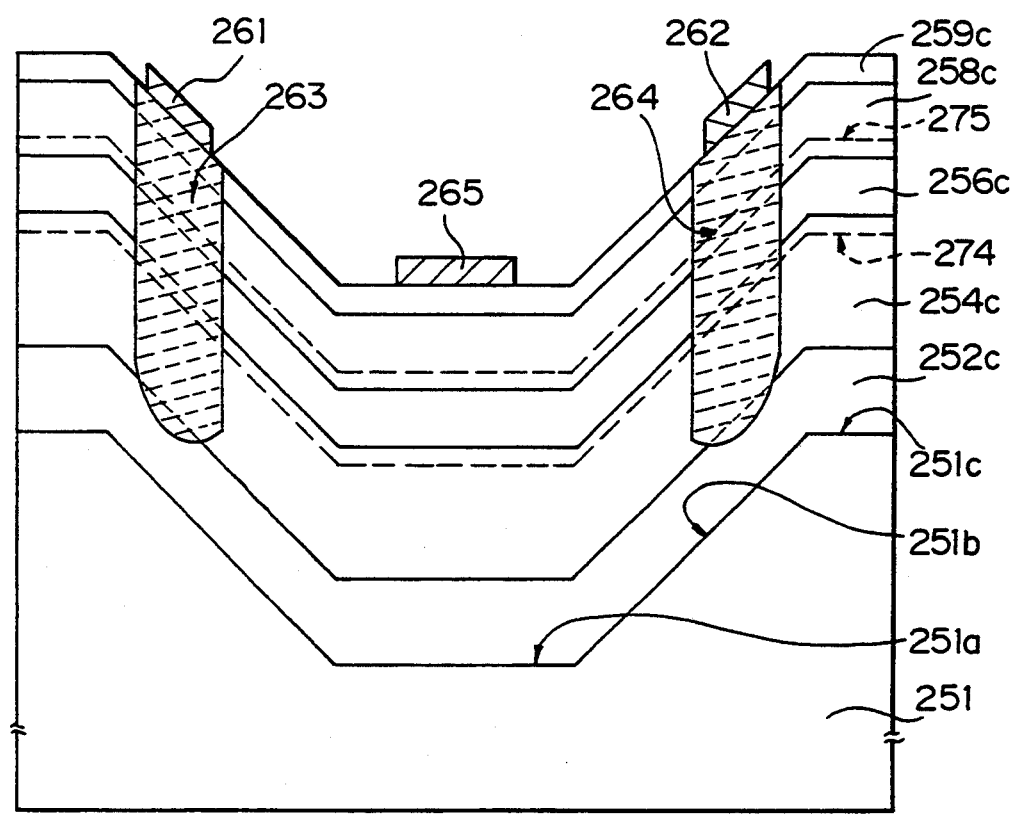
FIG. 22 is a schematic sectional view of a quantum interference effect transistor according to a seventh example of the present invention.

Referring to FIG. 22, a seventh quantum interference effect transistor according to the eighth embodiment and a method of producing the same are now explained. Reference numerals in FIG. 22 being the same as those used in FIG. 17 indicate the same parts or similar parts of the transistor of FIG. 17.

As explained in the example 5, a resist pattern is formed on a flat semi-insulating GaAs (100) substrate 251, and an uncoated portion of the substrate is anisotropically etched with the etching solution of $H_3PO_4$ and $H_2O_2$ at 11° C. to form a groove of an inverted isosceles trapezoid, as shown in FIG. 20. The groove has bottom flat surface 251a of (100) plane and slopes 251b of (111)A plane making an angle of 55° with the (100) plane. The resist pattern is then removed.

As shown in FIG. 22, on the substrate 251 with the groove, an undoped GaAs layer 252c, an n-type AlGaAs (first semiconductor) layer 254c, an undoped GaAs channel layer 256c, an n-type AlGaAs (third semiconductor) layer 258c and an n-type GaAs layer 259c are successively and epitaxially grown by an MBE method. The GaAs layer 252c has a thickness of 1 μm, the doped AlGaAs layer 254c has a thickness of 315 nm, the channel layer 256c has a thickness of 30 nm, the AlGaAs layer 258c has a thickness of 100 nm, and the GaAs layer 48d has a thickness of 10 nm and an impurity concentration of $1 \times 10^{18}$ cm$^{-3}$. The mentioned thicknesses are obtained at the flat portions of the layers on the top and bottom flat surfaces. The slope portions of each of the formed layers has a thickness of 70% of the above-mentioned values.

According to the eighth embodiment, in the molecular beam epitaxial growth of the AlGaAs layers 254c and 256c, undoped AlGaAs is deposited, Si is doped at a dose (area concentration) of $5 \times 10^{12}$ cm$^{-2}$ in an atomic plane by an atomic-plane doping process, and undoped AlGaAs is redeposited. In this case, a distance between the lower surface of the channel layer 256c and the Si atomic-plane 274 in the layer 254c is 15 nm, and a distance between the upper surface of the layer 256c and the Si atomic-plane 275 in the layer 258c is 15 nm.

A source electrode 261 and a drain electrode 262 of AuGe/Au are formed on the slopes of the n-type GaAs layer 259c. Then, an annealing (heat treatment) step is performed to form alloying regions (i.e., a source region 263 and a drain region 264) extending in the AlGaAs layer 254c through the channel layer 256c in the same manner as that of the example 5.

Next, a gate electrode 265 of Al is formed on the groove bottom surface of the GaAs layer 259b above the middle portion of the channel layer 256. Thus, the quantum interference effect transistor is obtained.

It is possible to form the barrier regions mentioned in the example 1 in at least the channel layer 256b.

Ninth Embodiment

Figure 23:
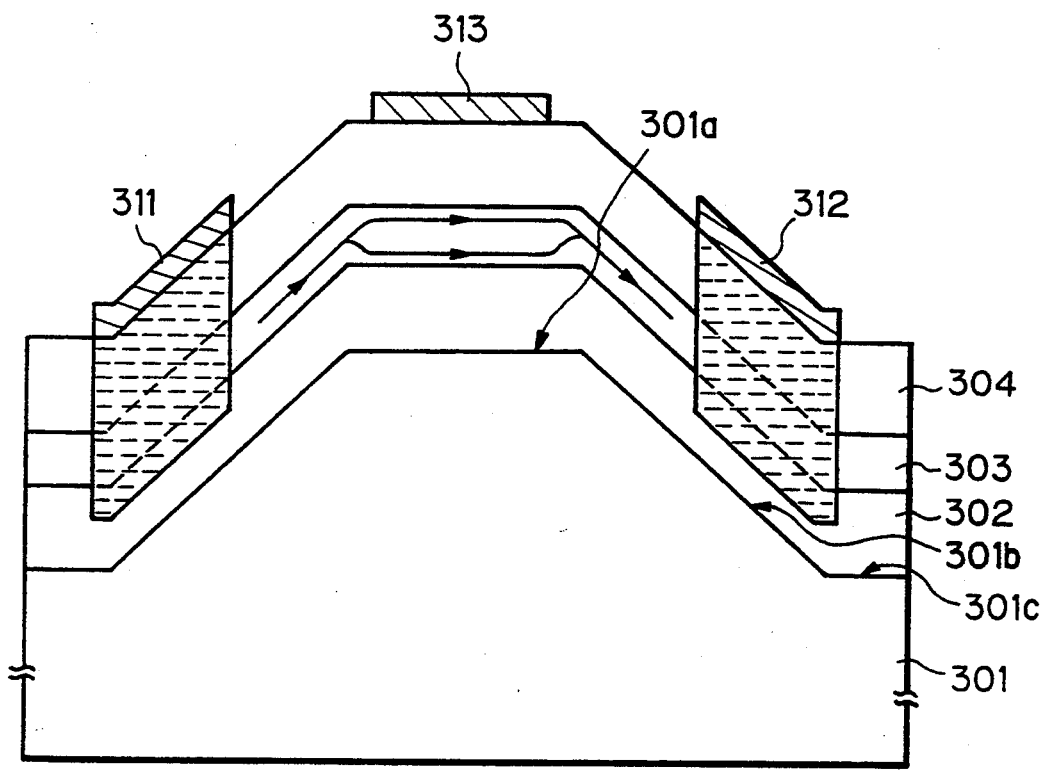
FIG. 23 is a schematic sectional view of a quantum interference effect transistor according to a ninth embodiment of the present invention.

As shown in FIG. 23, a ninth quantum interference effect transistor is similar to the fifth transistor of FIG. 15a, except that a projecting mesa portion is formed by selectively and anisotropically etching the flat semiconductor substrate 201 instead of the formation of the groove. The mesa portion has an isosceles trapezoid section and a mesa top flat surface 301b of, e.g., (100) plane and two slopes 301b of, i.e., (111)A plane. Thus, a portion of the original flat surface of the substrate remains as the mesa top surface 301a, and bottom flat surfaces 301c (of, e.g., (100) plane) are bottoms of etched grooves.

On the substrate 301, an n-type first semiconductor layer 302, a channel second semiconductor layer 303 and an n-type third semiconductor layer 304 are successively and epitaxially grown by an MBE method. Each of the layers 302, 303 and 304 consists of thicker middle portions on the mesa top flat surface 301a and the bottom surfaces 301c and thinner lead portions on the slopes 301b. A thickness of the lead portions is about 70% of that of the middle portion.

A source electrode 311 and a drain electrode 312 are made of AuGe/Au and are formed on the slopes (and the bottom surface) of the third layer 304. Then, an annealing (heat treatment) step is performed to form alloying regions (i.e., a source region and a drain region) extending in the first layer 302 through the channel second layer 303. A gate electrode 313 of Al is formed on the mesa top surface of the third layer 304.

In this case, energy band diagrams of quantum wells formed by the three layers at the slope and at the middle (mesa) portion are similar to those of FIGS. 15b and 15c, respectively. Therefore, the improved quantum interference effect transistor is obtained.

It will be obvious that the present invention is not restricted to the above-mentioned embodiments and that many variations are possible for persons skilled in the art without departing from the scope of the invention.

We claim:

1. A quantum interference effect semiconductor device comprising:
  as n-type first semiconductor layer formed on a semiconductor substrate;
  a second semiconductor layer which is formed on said first semiconductor layer and has an electron affinity larger than that of said first semiconductor layer, and in which a two dimensional electron gas channel is generated, a first interface being formed between said first semiconductor layer and said second semiconductor layer;
  an n-type third semiconductor layer which is formed on said second semiconductor layer and has an electron affinity smaller than that of said second semiconductor layer, a second interface being formed between said second semiconductor layer and said third semiconductor layer;
  a gate electrode on said third semiconductor layer;
  a source electrode and a drain electrode formed on said third semiconductor layer and located apart from said gate electrode with said gate electrode positioned therebetween;
  a source region formed under said source electrode and extending into said first semiconductor layer; and
  a drain region formed under said drain electrode and extending into said first semiconductor layer, wherein:
    said two dimensional electron gas channel generated in said second semiconductor layer results from the electron affinity of said second semiconductor layer being larger than the electron affinity of either said first semiconductor layer or said third semiconductor layer, and said two dimensional electron gas channel exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to said first interface and a second channel passage in proximity to said second interface, said second semiconductor layer includes a middle portion, a lead portion located near said source region and a lead portion located near said drain region, the middle portion being located below said gate electrode and being thicker than the lead portions, the middle channel portion of said two-dimensional electron gas channel corresponding to the middle portion of said second semiconductor layer and, in the middle portion of said second semiconductor layer, a quantum well width is widened to intensify a bending profile of a conduction band bottom so as to make two peaks in an electron probability density distribution in proximity to said first interface and said second interface, respectively, so that the middle channel portion of said two-dimensional electron gas channel is divided into the first and second channel passages and in the lead portions of said second semiconductor layer, the electron probability density distribution has one peak, said semiconductor substrate has top flat surface portions, a bottom flat surface portion which is arranged between the top surface portions and corresponds to the middle portion of said second semiconductor layer, and slope portions between the bottom portion and the top portions, each of said first, second and third semiconductor layers comprising a thicker middle portion for a wide quantum well above the bottom flat surface and thinner lead portions for a narrow quantum well above the slope portions, said source and drain regions formed above the slope portions.

2. A semiconductor device as in claim 1, wherein the top flat surface portions and the bottom flat surface portion of said semiconductor substrate are a (100) plane and the slope portions of said semiconductor substrate are (111)A plane.

3. A quantum interference effect semiconductor device comprising:

an n-type first semiconductor layer formed on a semiconductor substrate;

a second semiconductor layer which is formed on said first semiconductor layer and has an electron affinity larger than that of said first semiconductor layer, and in which a two dimensional electron gas channel is generated, a first interface being formed between said first semiconductor layer and said second semiconductor layer;

an n-type third semiconductor layer which is formed on said second semiconductor layer and has an electron affinity smaller than that of said second semiconductor layer, a second interface being formed between said second semiconductor layer and said third semiconductor layer;

a gate electrode on said third semiconductor layer;

a source electrode and a drain electrode formed on said third semiconductor layer and located apart from said gate electrode with said gate electrode positioned therebetween;

a source region formed under said source electrode and extending into said first semiconductor layer; and a drain region formed under said drain electrode and extending into said first semiconductor layer, wherein:

said two dimensional electron gas channel generated in said second semiconductor layer results from the electron affinity of said second semiconductor layer being larger than the electron affinity of either said first semiconductor layer or said third semiconductor layer, and said two dimensional electron gas channel exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to said first interface and a second channel passage in proximity to said second interface, said second semiconductor layer includes a middle portion, a lead portion located near said source region and a lead portion located near said drain region, the middle portion being located below said gate electrode and being thicker than the lead portions, the middle channel portion of said two-dimensional electron gas channel corresponding to the middle portion of said second semiconductor layer and, in the middle portion of said second semiconductor layer, a quantum well width is widened to intensify a bending profile of a conduction band bottom so as to make two peaks in an electron probability density distribution in proximity to said first interface and said second interface, respectively, so that the middle channel portion of said two-dimensional electron gas channel is divided into the first and second channel passages and, in the lead portions of said second semiconductor layer, the electron probability density distribution has one peak, said semiconductor substrate includes a bottom flat surface and a mesa portion of an isosceles trapezoid, the mesa portion having a mesa top flat surface, and slope portions, and each of said first, second and third semiconductor layers comprises a thicker middle portion for a wide quantum well above the mesa top flat surface and thinner lead portions for a narrow quantum well above the slope portions, said source and drain regions formed above the slope portions.

4. A semiconductor device as in claim 3, wherein the mesa top flat surface and the bottom flat surface of said semiconductor substrate are a (100) plane and the slope portions of said semiconductor substrate are (111)A plane.

5. A quantum interference effect semiconductor device, comprising:

an n-type first semiconductor layer formed on a semiconductor substrate;

a second semiconductor layer which is formed on said first semiconductor layer and has an electron affinity larger than that of said first semiconductor layer, and in which a two dimensional electron gas channel is generated, a first interface being formed between said first semiconductor layer and said second semiconductor layer;

an n-type third semiconductor layer which is formed said second semiconductor layer and has an electron affinity smaller than that of said second semiconductor layer, a second interface being formed between said second semiconductor layer and said third semiconductor layer;

a gate electrode on said third semiconductor layer;

a source electrode and a drain electrode formed on said third semiconductor layer and located apart from said gate electrode with said gate electrode positioned therebetween;

a source region formed under said source electrode and extending into said first semiconductor layer; and a drain region formed under said drain electrode and extending into said first semiconductor layer, wherein:

said two dimensional electron gas channel generated in said second semiconductor layer results from the electron affinity of said second semiconductor layer being larger than the electron affinity of either said first semiconductor layer or said third semiconductor layer, and said two dimensional electron gas channel exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to said first interface and a second channel passage in proximity to said second interface, said second semiconductor layer has a middle portion which corresponds to the middle channel portion of said two-dimensional electron gas channel, at least one of said first and third semiconductor layers is provided with an n-type impurity high concentration region which is located at a middle portion thereof and below said gate electrode adjacent to said second semiconductor layer and, in the middle portion of said second semiconductor layer coming into contact with said impurity high concentration region, a bending profile of a conduction band bottom is intensified to make two peaks in an electron probability density distribution in proximity to said first interface and said second interface, respectively, so that the middle channel portion of said two-dimensional electron gas channel is divided into the first and second channel passages and, in the lead portions of said second semiconductor layer, the electron probability density distribution has substantially one oak peak, said semiconductor substrate includes top flat surface portions, a bottom flat surface portion which is arranged between the top flat surface portions and corresponds to the middle portion of said second semiconductor layer, and slope portions between the bottom portion and the top flat surface portions, and each of said first, second and third semiconductor layers comprises a thicker middle portion for a wide quantum well above the bottom flat surface portion and thinner lead portions for a narrow quantum well above the slope portions, said source and drain regions formed above the slope portions.

6. A semiconductor device as in claim 5, wherein the top flat surface portions and the bottom flat surface portion of said semiconductor substrate are a (100) plane and the slope portions of said semiconductor substrate are (111)A plane.

7. A quantum interference effect semiconductor comprising:

an n-type first semiconductor layer formed on a semiconductor substrate;

a second semiconductor layer which is formed on said first semiconductor layer and has an electron affinity larger than that of said first semiconductor layer, and in which a two dimensional electron gas channel is generated, a first interface being formed between said first semiconductor layer and said second semiconductor layer;

an n-type third semiconductor layer which is formed on said second semiconductor layer and has an electron affinity smaller than that of said second semiconductor layer, a second interface being formed between said second semiconductor layer and said third semiconductor layer;

a gate electrode on said third semiconductor layer;

a source electrode and a drain electrode formed on said third semiconductor layer and located apart from said gate electrode with said gate electrode positioned therebetween;

a source region formed under said source electrode and extending into said first semiconductor layer; and a drain region formed under said drain electrode and extending into said first semiconductor layer, wherein:

said two dimensional electron gas channel generated in said second semiconductor layer results from the electron affinity of said second semiconductor layer being larger than the electron affinity of either said first semiconductor layer or said third semiconductor layer, and said two dimensional electron gas channel exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to said first interface and a second channel passage in proximity to said second interface, and said first semiconductor layer is provided with an n-type impurity high concentration region which is located at a middle portion thereof and below said gate electrode and is adjacent to said second semiconductor layer, said semiconductor device further comprising channel control electrodes which are formed on said third semiconductor layer and are located between said gate and source electrodes and between said gate and drain electrodes, respectively.

8. A semiconductor device as in claim 7, wherein said semiconductor substrate has top flat surface portions, a bottom flat surface portion which is arranged between the top surface portions and corresponds to middle portion of said second semiconductor layer, and slope portions between the bottom flat surface portion and the top flat surface portions, and each of said first, second and third semiconductor layers comprises a thicker middle portion for a wide quantum well above the bottom flat surface portion and thinner lead portions for a narrow quantum well above the slope portions, said source and drain regions formed above the slope portions.

9. A semiconductor device as in claim 8, wherein the top flat surface portions and the bottom flat surface portion of said semiconductor substrate are a (100) plane and the slope portions of said semiconductor substrate are (111)A plane.

10. A quantum interference effect semiconductor device comprising:
an n-type first semiconductor layer formed on a semiconductor substrate;
a second semiconductor layer which is formed on said first semiconductor layer and has an electron affinity larger than that of said first semiconductor layer, and in which a two dimensional electron gas channel is generated, a first interface being formed between said first semiconductor layer and said second semiconductor layer;
an n-type third semiconductor layer which is formed on said second semiconductor layer and has an electron affinity smaller than that of said second semiconductor layer, a second interface being formed between said second semiconductor layer and said third semiconductor layer;
a gate electrode on said third semiconductor layer;
a source electrode and a drain electrode formed on said third semiconductor layer and located apart from said gate electrode with said gate electrode positioned therebetween;
a source region formed under said source electrode and extending into said first semiconductor layer; and
a drain region formed under said drain electrode and extending into said first semiconductor layer, wherein:
said two dimensional electron gas channel generated in said second semiconductor layer results from the electron affinity of said second semiconductor layer being larger than the electron affinity of either said first semiconductor layer or said third semiconductor layer, and said two dimensional electron gas channel exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to said first interface and a second channel passage in proximity to said second interface,
said second semiconductor layer has a thickness as to divide said two dimensional electron gas channel into the first channel passage in proximity to said first interface between said first and second semiconductor layers and the second channel passage in proximity to said second interface between said second and third semiconductor layers by causing two peaks in the electron probability density distribution in proximity to said first interface and said second interface, respectively; and first and second hetero-interface portions are formed between said first and second semiconductor layers and third and fourth hetero-interface portions are formed between said second and third semiconductor layers wherein first and second conversion regions are formed at said first and second hetero-interface portions, respectively, near said source region and said drain region, respectively, and third and fourth conversion regions are formed at said third and fourth hetero-interface portions, respectively, near said source region and said drain region, respectively, said first and second conversion regions providing sloping connection lines between the conduction band bottoms of said first and second semiconductor layers, and said third and fourth conversion regions providing sloping connection lines between the conduction band bottoms of said second and third semiconductor layers.

11. A quantum interference effect semiconductor device comprising:
an n-type first semiconductor layer formed on a semiconductor substrate;
a second semiconductor layer which is formed on said first semiconductor layer and has an electron affinity larger than that of said first semiconductor layer, and in which a two dimensional electron gas channel is generated, a first interface being formed between said first semiconductor layer and said second semiconductor layer;
an n-type third semiconductor layer which is formed on said second semiconductor layer and has an electron affinity smaller than that of said second semiconductor layer, a second interface being formed between said second semiconductor layer and said third semiconductor layer;
a gate electrode on said third semiconductor layer;
a source electrode and a drain electrode formed on said third semiconductor layer and located apart from said gate electrode with said gate electrode positioned therebetween;
a source region formed under said source electrode and extending into said first semiconductor layer; and
a drain region formed under said drain electrode and extending into said first semiconductor layer, wherein:
said two dimensional electron gas channel generated fin said second semiconductor layer results from the electron affinity of said second semiconductor layer being larger than the electron affinity of either said first semiconductor layer or said third semiconductor layer, and said two dimensional electron gas channel exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to said first interface and a second channel passage in proximity to said second interface, said first and third semiconductor layers have such an impurity concentration as to divide said two dimensional electron gas channel into the first channel passage in proximity to said first interface and the second channel passage in proximity to said second interface by causing two peaks in the electron probability density distribution in proximity to said first interface and said second interface, respectively; and first and second hetero-interface portions are formed between said first and second semiconductor layers and third and fourth hetero-interface portions are formed between said second and third semiconductor layers wherein first and second conversion regions are formed at said first and second hetero-interface portions near said source region and said drain region, respectively, and third and fourth conversion regions are formed at said third and fourth hetero-interface portions, respectively, near said source region and said drain region, respectively, said first and second conversion regions providing sloping connection lines between the conduction band bottoms of said first and second semiconductor layers, and said third and fourth conversion regions providing sloping connection lines between the conduction band bottoms of said second and third semiconductor layers.

12. A semiconductor device as in claims 3 or 8, further comprising two barrier regions which are formed in a middle portion of said second semiconductor layer and are arranged in a direction at right angles to a channel direction to form a slit with said second semiconductor layer therebetween, having a slit width for quantizing kinetic energy of electron gas in the two dimensional electron gas channel in the direction at right angles to the two dimensional electron gas channel direction.

13. A quantum interference effect semiconductor device comprising:

an n-type first semiconductor layer formed on a semiconductor substrate;

a second semiconductor layer which is formed on said first semiconductor layer and has an electron affinity larger than that of said first semiconductor layer, and in which a two dimensional electron gas channel is generated;

an n-type third semiconductor layer which is formed on said second semiconductor layer and has an electron affinity smaller than that of said second semiconductor layer;

a gate electrode on said third semiconductor layer;

a source electrode and a drain electrode formed on said third semiconductor layer and located apart from said gate electrode with said gate electrode positioned therebetween;

a source region formed under said source electrode and extending into said first semiconductor layer; and a drain region formed under said drain electrode and extending into said first semiconductor layer, wherein said two dimensional electron gas channel generated in said second semiconductor layer exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to a first interface between said first and second semiconductor layers and a second channel passage in proximity to a second interface between said second and third semiconductor layers, said second semiconductor layer includes a middle portion, a lead portion located near said source region and a lead portion located near said drain region, the middle portion being located below said gate electrode and being thicker than the lead portions, the middle channel portion of said two-dimensional electron gas channel corresponding to the middle portion of said second semiconductor layer and, in the middle portion of said second semiconductor layer, a quantum well width is widened to intensify a bending profile of a conduction band bottom so as to make two peaks in an electron probability density distribution in proximity to said first interface and said second interface, respectively, so that the middle channel portion of said two-dimensional electron gas channel is divided into the first and second channel passages and, in the lead portions of said second semiconductor layer, the electron probability density distribution has one peak, said semiconductor substrate having top flat surface portions, a bottom flat surface portion which is arranged between said top surface portions and corresponds to the middle portion of said second semiconductor layer, and slope portions between the bottom portion and the top portions, each of said first, second and third semiconductor layers comprising a thicker middle portion for a wide quantum well above the bottom flat surface and thinner lead portions for a narrow quantum well above the slope portions, said source and drain regions are formed above the slope portions.

14. A semiconductor device as in claim 13, wherein the top flat surface portions and the bottom flat surface portion of said semiconductor substrate are a (100) plane and the slope portions of said semiconductor substrate are (111)A plane.

15. A quantum interference effect semiconductor device comprising:

an n-type first semiconductor layer formed on a semiconductor substrate;

a second semiconductor layer which is formed on said first semiconductor layer and has an electron affinity larger than that of said first semiconductor layer, and in which a two dimensional electron gas channel is generated;

an n-type third semiconductor layer which is formed on said second semiconductor layer and has an electron affinity smaller than that of said second semiconductor layer;

a gate electrode on said third semiconductor layer;

a source electrode and a drain electrode formed on said third semiconductor layer and located apart from said gate electrode with said gate electrode positioned therebetween;

a source region formed under said source electrode and extending into said first semiconductor layer; and a drain region formed under said drain electrode and extending into said first semiconductor layer, wherein said two dimensional electron gas channel generated in said second semiconductor layer exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to a first interface between said first and second semiconductor layers and a second channel passage in proximity to a second interface between said second and third semiconductor layers, said second semiconductor layer includes a middle portion, a lead portion located near said source region and a lead portion located near said drain region, the middle portion being located below said gate electrode and being thicker than the lead portions of said second semiconductor layer, the middle channel portion of said two dimensional electron gas channel corresponding to the middle portion of said second semiconductor layer and, in the middle portion of said second semiconductor layer, a quantum well width is widened to intensify a bending profile of a conduction band bottom so as to make two peaks in an electron probability density distribution in proximity to said first interface and said second interface, respectively, so that the middle channel portion of said two-dimensional electron gas channel is divided into said first and second channel passages and, in the lead portions of said second semiconductor layer, the electron probability density distribution has one peak, said semiconductor substrate includes:
a mesa portion of an isosceles trapezoid, the mesa portion including a mesa top flat surface, and slope portions, and
a bottom flat surface,
each of said first, second and third semiconductor layers comprises a thicker middle portion for a wide quantum well above the mesa top flat surface and thinner lead portions for a narrow quantum well above the slope portions, said source and drain regions formed above the slope portions.

16. A semiconductor device as in claim 15, wherein the mesa top flat surface and the bottom flat surface of said semiconductor substrate are a (100) plane and the slope portions of said semiconductor substrate are (111)A plane.

17. A quantum interference effect semiconductor device comprising:
an n-type first semiconductor layer formed on a semiconductor substrate;
a second semiconductor layer which is formed on said first semiconductor layer and has an electron affinity larger than that of said first semiconductor layer, and in which a two dimensional electron gas channel is generated;
an n-type third semiconductor layer which is formed on said second semiconductor layer and has an electron affinity smaller than that of said second semiconductor layer;
a gate electrode on said third semiconductor layer;
a source electrode and a drain electrode formed on said third semiconductor layer and located apart from said gate electrode with said gate electrode positioned therebetween;
a source region formed under said source electrode and extending into said first semiconductor layer; and
a drain region formed under said drain electrode and extending into said first semiconductor layer, wherein said two dimensional electron gas channel generated in said second semiconductor layer exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to a first interface between said first and second semiconductor layers and a second channel passage in proximity to a second interface between said second and third semiconductor layers, said first semiconductor layer is provided with an n-type impurity high concentration region which is located at a middle portion thereof and below said gate electrode and is adjacent to said second semiconductor layer, said semiconductor device further comprising channel control electrodes which are formed on said third semiconductor layer and are located between said gate and source electrodes and between said gate and drain electrodes, respectively.

18. A semiconductor device according to one of claims 13, 15 and 17, further comprising two barrier regions which are formed in a middle portion of said second semiconductor layer and are arranged in a direction at right angles to a channel direction to form a slit with said second semiconductor layer therebetween, having a slit width for quantizing kinetic energy of electron gas in said two dimensional electron gas channel in the direction at right angles to the channel direction.

19. A quantum interference effect semiconductor device comprising:
an n-type first semiconductor layer formed on a semiconductor substrate;
a second semiconductor layer which is formed on said first semiconductor layer and has an electron affinity larger than that of said first semiconductor layer, and in which a two dimensional electron gas channel is generated;
an n-type third semiconductor layer which is formed on said second semiconductor layer and has an electron affinity smaller than that of said second semiconductor layer;
a gate electrode on said third semiconductor layer;
a source electrode and a drain electrode formed on said third semiconductor layer and located apart from said gate electrode with said gate electrode positioned therebetween;

a source region formed under said source electrode and extending into said first semiconductor layer; and a drain region formed under said drain electrode and extending into said first semiconductor layer;

wherein said two dimensional electron gas channel generated in said second semiconductor layer exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to a first interface between said first and second semiconductor layers and a second channel passage in proximity to a second interface between said second and third semiconductor layers; and two barrier regions which are formed in a middle portion of said second semiconductor layer and are arranged in a direction at right angles to a channel direction to form a slit with said second semiconductor layer therebetween, having a slit width for quantizing kinetic energy of electron gas in the two dimensional electron gas channel in the direction at right angles to the channel direction.

20. A quantum interference effect semiconductor device comprising:

an n-type first semiconductor layer formed on a semiconductor substrate;

a second semiconductor layer which is formed on said first semiconductor layer and has an electron affinity larger than that of said first semiconductor layer, and in which a two dimensional electron gas channel is generated;

an n-type third semiconductor layer which is formed on said second semiconductor layer and has an electron affinity smaller than that of said second semiconductor layer;

a gate electrode on said third semiconductor layer;

a source electrode and a drain electrode formed on said third semiconductor layer and located apart from said gate electrode with said gate electrode positioned therebetween;

a source region formed under said source electrode and extending into said first semiconductor layer; and a drain region formed under said drain electrode and extending into said first semiconductor layer; wherein said two dimensional electron gas channel generated in said second semiconductor layer exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to a first interface between said first and second semiconductor layers and a second channel passage in proximity to a second interface between said second and third semiconductor layers, said second semiconductor layer includes a middle portion, a lead portion located near said source region and a lead portion located near said drain region, the middle portion being located below said gate electrode and being thicker than the lead portions of said second semiconductor layer, the middle channel portion of said two dimensional electron gas channel corresponds to the middle portion of said second semiconductor layer and, in the middle portion of said second semiconductor layer, a quantum well width is widened to intensify a bending profile of a conduction band bottom so as to make two peaks in an electron probability density distribution in proximity to said first interface and said second interface, respectively, so that the middle channel portion of said two-dimensional electron gas channel is divided into said first and second channel passages and, in the lead portions of said second semiconductor layer, the electron probability density distribution has one peak; and two barrier regions formed in the middle portion of said second semiconductor layer and arranged in a direction at right angles to a channel direction to form a slit with said second semiconductor layer therebetween, having a slit width for quantizing kinetic energy of electron gas in the two dimensional electron gas channel in the direction at right angles to the channel direction.

21. A quantum interference effect semiconductor device comprising:

an n-type first semiconductor layer formed on a semiconductor substrate;

a second semiconductor layer which is formed on said first semiconductor layer and has an electron affinity larger than that of said first semiconductor layer, and in which a two dimensional electron gas channel is generated;

an n-type third semiconductor layer which is formed on said second semiconductor layer and has an electron affinity smaller than that of said second semiconductor layer;

a gate electrode on said third semiconductor layer;

a source electrode and a drain electrode formed on said third semiconductor layer and located apart from said gate electrode with said gate electrode positioned therebetween;

a source region formed under said source electrode and extending into said first semiconductor layer; and a drain region formed under said drain electrode and extending into said first semiconductor layer; wherein said two dimensional electron gas channel generated in said second semiconductor layer exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to a first interface between said first and second semiconductor layers and a second channel passage in proximity to a second interface between said second and third semiconductor layers, at least one of said first and third semiconductor layers is provided with an n-type impurity high concentration region which is located at a middle portion thereof and below said gate electrode adjacent to said second semiconductor layer and, in a middle portion of said second semiconductor layer coming into contact with said impurity high concentration region and corresponding to the middle channel portion of said two dimensional electron gas channel, a bending profile of a conduction band bottom is intensified to make two peaks in an electron probability density distribution in proximity to said first interface and said second interface, respectively, so that the middle channel portion of said two-dimensional electron gas channel is divided into the first and second channel passages and, in the lead portions of said second semiconductor layer, the electron probability density distribution has substantially one peak; and two barrier regions which are formed in the middle portion of said second semiconductor layer and are arranged in a direction at right angles to a channel direction to form a slit with said second semiconductor layer therebetween, having a slit width for quantizing kinetic energy of electron gas in the two dimensional electron gas channel in the direction at right angles to the channel direction.

22. A quantum interference effect semiconductor device comprising:

an n-type first semiconductor layer formed on a semiconductor substrate;

a second semiconductor layer which is formed on said first semiconductor layer and has an electron affinity larger than that of said first semiconductor layer, and in which a two dimensional electron gas channel is generated;

an n-type third semiconductor layer which is formed on said second semiconductor layer and has an electron affinity smaller than that of said second semiconductor layer;

a gate electrode on said third semiconductor layer;

a source electrode and a drain electrode formed on said third semiconductor layer and located apart from said gate electrode with said gate electrode positioned therebetween;

a source region formed under said source electrode and extending into said first semiconductor layer; and a drain region formed under said drain electrode and extending into said first semiconductor layer; wherein said two dimensional electron gas channel generated in said second semiconductor layer exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to a first interface between said first and second semiconductor layers and a second channel passage in proximity to a second interface between said second and third semiconductor layers, at least one of said first and third semiconductor layers is provided with an n-type impurity high concentration region which is located at a middle portion thereof and below said gate electrode adjacent to said second semiconductor layer and, in a middle portion of said second semiconductor layer coming into contact with said impurity high concentration region and corresponding to the middle channel portion of said two-dimensional electron gas channel, a bending profile of a conduction band bottom is intensified to make two peaks in an electron probability density distribution in proximity to said first interface and said second interface, respectively, so that the middle channel portion of said two-dimensional electron gas channel is divided into the first and second channel passages and, in the lead portions of said second semiconductor layer, the electron probability density distribution has substantially one peak, said semiconductor substrate includes top flat surface portions, a bottom flat surface portion which is arranged between the top flat surface portions and corresponds to the middle portion of said second semiconductor layer, and slope portions between the bottom portion and the top flat surface portions, each of said first, second and third semiconductor layers comprises a thicker middle portion for a wide quantum well above the bottom flat surface portion and thinner lead portions for a narrow quantum well above the slope portions, said source and drain regions are formed above the slope portions; and two barrier regions which are formed in the middle portion of said second semiconductor layer and are arranged in a direction at right angles to a channel direction to form a slit with said second semiconductor layer therebetween, having a slit width for quantizing kinetic energy of electron gas in the two dimensional electron gas channel in the direction at right angles to the channel direction.

23. A quantum interference effect semiconductor device comprising:

an n-type first semiconductor layer formed on a semiconductor substrate;

a second semiconductor layer which is formed on said first semiconductor layer and has an electron affinity larger than that of said first semiconductor layer, and in which a two dimensional electron gas channel is generated;

an n-type third semiconductor layer which is formed on said second semiconductor layer and has an electron affinity smaller than that of said second semiconductor layer;

a gate electrode on said third semiconductor layer;

a source electrode and a drain electrode formed on said third semiconductor layer and located apart from said gate electrode with said gate electrode positioned therebetween;

a source region formed under said source electrode and extending into said first semiconductor layer; and a drain region formed under said drain electrode and extending into said first semiconductor layer; wherein said two dimensional electron gas channel generated in said second semiconductor layer exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to a first interface between said first and second semiconductor layers and a second channel passage in proximity to a second interface between said second and third semiconductor layers, said first semiconductor layer is provided with an n-type impurity high concentration region which is located at a middle portion thereof and below said gate electrode and is adjacent to said second semiconductor layer, said semiconductor device further comprising channel control electrodes which are formed on said third semiconductor layer and are located between said gate and source electrodes and between said gate and drain electrodes, respectively, said semiconductor substrate has top flat surface portions, a bottom flat surface portion which is arranged between the top surface portions and corresponds to the middle portion of said second semiconductor layer, and slope portions between the bottom flat surface portion and the top flat surface portions, each of said first, second and third semiconductor layers comprises a thicker middle portion for a wide quantum well above the bottom flat surface portion and thinner lead portions for a narrow quantum well above the slope portions, said source and drain regions formed above the slope portions; and two barrier regions which are formed in the middle portion of said second semiconductor layer and are arranged in a direction at right angles to a channel direction to form a slit with said second semiconductor layer therebetween, having a slit width for quantizing a kinetic energy of the two dimensional electron gas in the direction at right angles to the channel direction.

24. A quantum interference effect semiconductor device comprising:

an n-type first semiconductor layer formed on a semiconductor substrate;

a second semiconductor layer which is formed on said first semiconductor layer and has an electron affinity larger than that of said first semiconductor layer, and in which a two dimensional electron gas channel is generated;

an n-type third semiconductor layer which is formed on said second semiconductor layer and has an electron affinity smaller than that of said second semiconductor layer;

a gate electrode on said third semiconductor layer;

a source electrode and a drain electrode formed on said third semiconductor layer and located apart from said gate electrode with said gate electrode positioned therebetween;

a source region formed under said source electrode and extending into said first semiconductor layer; and a drain region formed under said drain electrode and extending into said first semiconductor layer; wherein said two dimensional electron gas channel generated in said second semiconductor layer exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to a first interface between said first and second semiconductor layers and a second channel passage in proximity to a second interface between said second and third semiconductor layers, said second semiconductor layer has a thickness as to divide said two dimensional electron gas channel into the first channel passage in proximity to said first interface between said first and second semiconductor layers and the second channel passage in proximity to said second interface between said second and third semiconductor layers by causing two peaks in the electron probability density distribution in proximity to said first interface and said second interface, respectively, and a first and second hetero-interface portions are formed between said first and second semiconductor layers and a third and fourth hetero-interface portions are formed between said second and third semiconductor layers wherein first and second conversion regions are formed at said first and second hetero-interface portions, respectively, near said source region and said drain region, respectively, and third and fourth conversion regions are formed at said third and fourth hetero-interface portions, respectively, near said source region and said drain region, respectively, said first and second conversion regions providing sloping connection lines between the conduction band bottoms of said first and second semiconductor layers, and said third and fourth conversion regions providing sloping connection lines between the conduction band bottoms of said second and third semiconductor layers, respectively; and two barrier regions which are formed in the middle portion of said second semiconductor layer and are arranged in a direction at right angles to a channel direction to form a slit with said second semiconductor layer therebetween, having a slit width for quantizing kinetic energy of electron gas in the two dimensional electron gas channel in the direction at right angles to the channel direction.

25. A quantum interference effect semiconductor device comprising:

an n-type first semiconductor layer formed on a semiconductor substrate;

a second semiconductor layer which is formed on said first semiconductor layer and has an electron affinity larger than that of said first semiconductor layer, and in which a two dimensional electron gas channel is generated;

an n-type third semiconductor layer which is formed on said second semiconductor layer and has an electron affinity smaller than that of said second semiconductor layer;

a gate electrode on said third semiconductor layer;

a source electrode and a drain electrode formed on said third semiconductor layer and located apart from said gate electrode with said gate electrode positioned therebetween;

a source region formed under said source electrode and extending into said first semiconductor layer; and a drain region formed under said drain electrode and extending into said first semiconductor layer; wherein said two dimensional electron gas channel generated in said second semiconductor layer exists between said source region and said drain region, said two-dimensional electron gas channel comprising a lead channel portion near said source region and a lead channel portion near said drain region, each of the lead channel portions forming one lead channel passage, and a middle channel portion which is located below said gate electrode and is divided into a first channel passage in proximity to a first interface between said first and second semiconductor layers and a second channel passage in proximity to a second interface between said second and third semiconductor layers, said first and third semiconductor layers have such an impurity concentration as to divide said two dimensional electron gas channel into the first channel passage in proximity to said first interface and the second channel passage in proximity to said second interface by making two peaks in the electron probability density distribution in proximity to said first interface and said second interface, respectively, a first and second hetero-interface portions are formed between said first and second semiconductor layers and a third and fourth hetero-interface portions are formed between said second and third semiconductor layers wherein first and second conversion regions are formed at said first and second hetero-interface portions near said source region and said drain region, respectively, and third and fourth conversion regions are formed at said third and fourth hetero-interface portions, respectively, near said source region and said drain region, respectively, said first and second conversion regions providing sloping connection lines between the conduction band bottoms of said first and second semiconductor layers, and said third and fourth conversion regions providing sloping connection lines between the conduction band bottoms of said second and third semiconductor layers, respectively;

two barrier regions which are formed in the middle portion of said second semiconductor layer and are arranged in a direction at right angles to a channel direction to form a slit with said second semiconductor layer therebetween, having a slit width for quantizing kinetic energy of electron gas in the two dimensional electron gas channel in the direction at right angles to the channel direction.

26. A semiconductor device as in claim 1, further comprising:

a non-doped fourth semiconductor layer having an electron affinity smaller than that of said second semiconductor layer and existing between said first and second semiconductor layers; and a non-doped fifth semiconductor layer having an electron affinity smaller than that of said second semiconductor layer and existing between said second and third semiconductor layers.

27. A semiconductor device as in claim 1, wherein said first semiconductor layer and said third semiconductor layer are respectively doped with impurities by an atomic-plane doping method.

* * * * *

UNITED STATES PATENT AND TRADEMARK OFFICE
CERTIFICATE OF CORRECTION

PATENT NO. : 5,406,094
DATED : Apr. 11, 1995
INVENTOR(S) : ARIMOTO et al.

It is certified that error appears in the above-indentified patent and that said Letters Patent is hereby corrected as shown below:

Col. 23, line 18 (Claim 1), after "and" (second occurrence) insert --,--.

Col. 25, line 54 (Claim 5), change "one oak peak," to --one peak--.

Col. 26, line 67 (Claim 8), after "to" insert --a--.

Signed and Sealed this

Fourteenth Day of October, 1997

Attest:

BRUCE LEHMAN

*Attesting Officer*   *Commissioner of Patents and Trademarks*